US012672489B1

(12) United States Patent
Narayanan et al.

(10) Patent No.: US 12,672,489 B1
(45) Date of Patent: Jun. 30, 2026

(54) RESISTIVE SWITCHING MEMORY HAVING CONFINED FILAMENT FORMATION AND METHODS THEREOF

(71) Applicant: Crossbar, Inc., Santa Clara, CA (US)

(72) Inventors: Sundar Narayanan, Cupertino, CA (US); Wee Chen Gan, Cupertino, CA (US); Natividad Vasquez, Jr., San Francisco, CA (US); Wei Ti Lee, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 84 days.

(21) Appl. No.: 18/676,046

(22) Filed: May 28, 2024

Related U.S. Application Data

(63) Continuation of application No. 17/218,608, filed on Mar. 31, 2021, now Pat. No. 11,997,932.

(51) Int. Cl.
*H10N 70/00* (2023.01)
*H10B 63/00* (2023.01)

(52) U.S. Cl.
CPC ........... *H10N 70/063* (2023.02); *H10B 63/82* (2023.02); *H10N 70/026* (2023.02); *H10N 70/066* (2023.02); *H10N 70/841* (2023.02); *H10N 70/8833* (2023.02)

(58) Field of Classification Search
CPC ............. H10N 70/826; H10N 70/8416; H10N 70/883; H10N 70/063; H10N 70/066; H10N 70/026
See application file for complete search history.

(56) References Cited

U.S. PATENT DOCUMENTS

| | | | |
|---|---|---|---|
| 8,946,046 B1 | 2/2015 | Jo | |
| 9,559,299 B1 | 1/2017 | Jo | |
| 9,570,678 B1 | 2/2017 | Jo et al. | |
| 11,997,932 B2 * | 5/2024 | Narayanan | ............. H10B 63/82 |

FOREIGN PATENT DOCUMENTS

| | | |
|---|---|---|
| CN | 103119717 A | 5/2013 |
| CN | 104037187 A | 9/2014 |
| WO | 2011/008654 A1 | 1/2011 |

OTHER PUBLICATIONS

First Office action for Chinese Patent Application No. 202111537928X dated Mar. 30, 2024, 17 pages long.

* cited by examiner

*Primary Examiner* — Mark V Prenty
(74) *Attorney, Agent, or Firm* — Wegman Hessler

(57) ABSTRACT

Resistive switching memory cells having filament-based switching mechanisms are provided. By way of example, resistive switching memory cells having resistive filaments constrained to a core of the cell are disclosed. In other examples, methods for fabricating resistive switching memory cells to constrain a conductive filament formed in the resistive switching memory cell to a central portion of core of the cell are disclosed.

21 Claims, 25 Drawing Sheets

RESISTIVE MEMORY DEPOSITION
100

RESISTIVE MEMORY DEPOSITION
<u>100</u>

BOTTOM PLATE DEPOSITION OVER BOTTOM
ELECTRODE AND DIELECTRIC
200

SWITCHING LAYER₁ DEPOSITION
300

SWITCHING LAYER$_1$ ETCH
400

SWITCHING LAYER₂ DEPOSITION
500

TOP ELECTRODE DEPOSITION
600

Noble metal; Diffusive Metal alloy/mixture/compound;
Non-Stoichiometric metal-nitrogen or metal-oxygen; etc.

612 — TOP ELECTRODE – FILAMENT DONOR

510 — SWITCHING LAYER$_2$

408 — ETCHED SWITCHING LAYER$_1$

206 — BOTTOM PLATE

104 — BOTTOM ELECTRODE

102 —

OPTIONAL BARRIER, HARD MASK AND RESIST
DEPOSITION (AND RESIST PATTERN)
700

RESISTIVE DEVICE ETCH AND PATTERN REMOVAL
800

EXAMPLE FILAMENT FORMATION
900

SECOND EMBODIMENT:
BOTTOM PLATE, SWITCHING LAYER AND BARRIER
LAYER DEPOSITION
1000

SECOND EMBODIMENT:
BARRIER LAYER ETCH
<u>1100</u>

SECOND EMBODIMENT:
CONTROLLED ETCH / TREATMENT
1200

TREATED / ACTIVATED
SWITCHING SEGMENT
1212

1110 — BARRIER LAYER

1008 — SWITCHING LAYER

1006 — BOTTOM PLATE

104 —

BOTTOM
ELECTRODE

102 —

SECOND EMBODIMENT:
TOP ELECTRODE DEPOSITION
1300

SECOND EMBODIMENT:
OPTIONAL BARRIER, HARD MASK AND RESIST
DEPOSITION
1400

SECOND EMBODIMENT:
RESISTIVE DEVICE ETCH AND RESIST REMOVAL
<u>1500</u>

THIRD EMBODIMENT:
BOTTOM PLATE, SWITCHING LAYER, TOP
ELECTRODE AND CAPPING LAYER DEPOSITION
1600

| | |
|---|---|
| 1612 | CAPPING LAYER |
| 1610 | TOP ELECTRODE LAYER |
| 1608 | SWITCHING LAYER |
| 1606 | BOTTOM PLATE |
| 104 | BOTTOM ELECTRODE |
| | 102 |

THIRD EMBODIMENT:
RESISTIVE DEVICE ETCH
1700
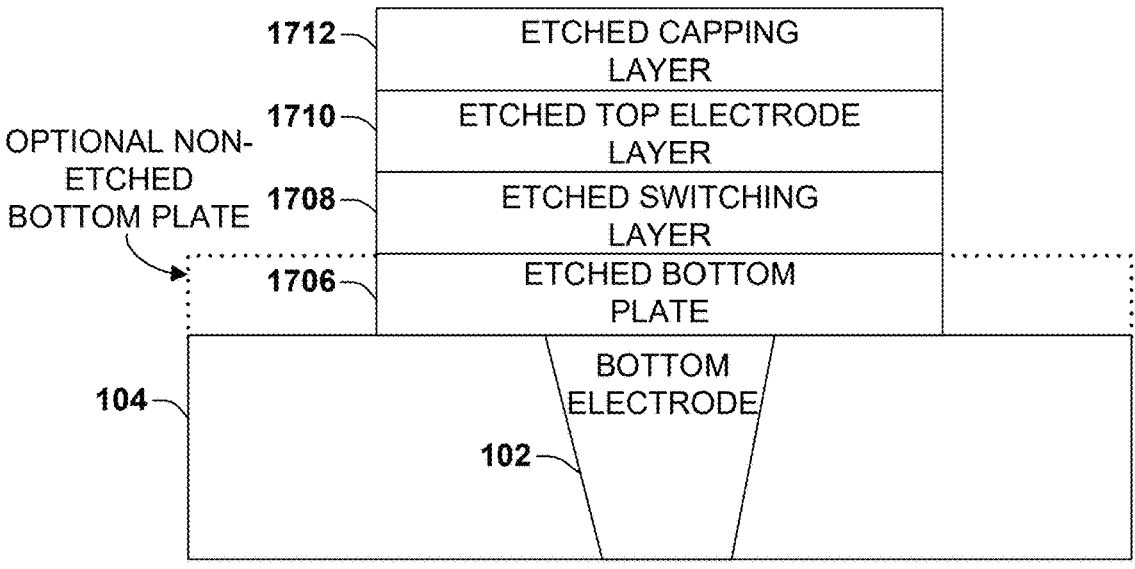
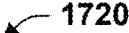
FIG. 17

THIRD EMBODIMENT:
SIDEWALL PASSIVATION
1800

SIDEWALL PASSIVATION: FIRST EMBODIMENT
1800 A

SIDEWALL PASSIVATION: SECOND EMBODIMENT
1800 D/E/F

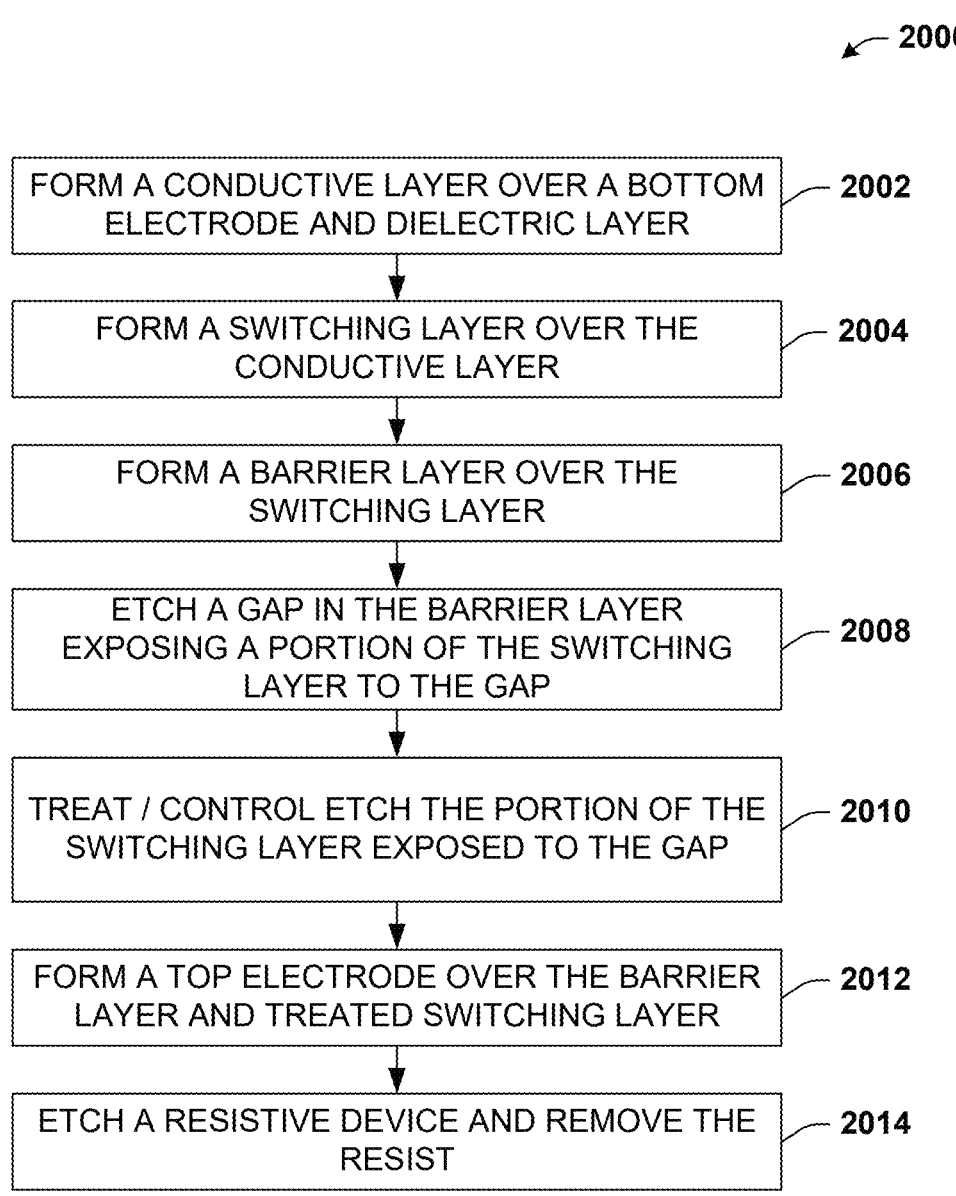

2000

FORM A CONDUCTIVE LAYER OVER A BOTTOM
ELECTRODE AND DIELECTRIC LAYER — 2002

FORM A SWITCHING LAYER OVER THE
CONDUCTIVE LAYER — 2004

FORM A BARRIER LAYER OVER THE
SWITCHING LAYER — 2006

ETCH A GAP IN THE BARRIER LAYER
EXPOSING A PORTION OF THE SWITCHING
LAYER TO THE GAP — 2008

TREAT / CONTROL ETCH THE PORTION OF THE
SWITCHING LAYER EXPOSED TO THE GAP — 2010

FORM A TOP ELECTRODE OVER THE BARRIER
LAYER AND TREATED SWITCHING LAYER — 2012

ETCH A RESISTIVE DEVICE AND REMOVE THE
RESIST — 2014

RESISTIVE SWITCHING MEMORY HAVING CONFINED FILAMENT FORMATION AND METHODS THEREOF

CROSS-REFERENCE TO RELATED APPLICATION

The present application for patent is a continuation of U.S. patent application Ser. No. 17/218,608 titled RESISTIVE SWITCHING MEMORY HAVING CONFINED FILAMENT FORMATION AND METHODS THEREOF and filed Mar. 31, 2021, which is hereby incorporated by reference herein in its entirety and for all purposes.

INCORPORATION BY REFERENCE

U.S. Pat. No. 9,425,237 filed Dec. 31, 2014 and entitled "SELECTOR DEVICE FOR TWO-TERMINAL MEMORY", U.S. Pat. No. 10,873,023 filed Mar. 24, 2017 and entitled "USING ALUMINUM AS ETCH STOP LAYER", U.S. Pat. No. 10,522,754 filed Apr. 5, 2017 and entitled "LINER LAYER FOR A DIELECTRIC BLOCK LAYER" and U.S. Pat. No. 10,749,110 filed Apr. 13, 2017 and entitled "MEMORY STACK LINER COMPRISING DIELECTRIC BLOCK LAYER MATERIAL", are each hereby incorporated by reference herein in their respective entireties and for all purposes.

TECHNICAL FIELD

Embodiments of the present disclosure pertain to electronic memory structures; for example, various embodiments disclose apparatuses and methods for fabricating resistive switching memory structures.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory.

Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventors have desired new mechanisms for processing semiconductor wafers, and particularly processing resistive memory structures within one or more semiconductor wafers, that overcome current challenges in the art encountered by the inventors.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Embodiments of the present disclosure provide for resistive switching memory cells having filament-based switching mechanisms. Further, these resistive switching memory cells can have resistive filaments constrained to a core of the cell. In an embodiment, methods for fabricating such resistive switching memory cells are disclosed.

In an embodiment, provided is a method for fabricating a resistive switching device. The method can comprise providing a bottom electrode formed within a dielectric material overlying a substrate of a device and forming a conductive layer overlying and in contact with both the bottom electrode and the dielectric layer. Moreover, the method can comprise forming a first resistive switching layer overlying the conductive layer, wherein the first resistive switching layer is an electrically resistive material and etching a gap in the first resistive switching layer and exposing a portion of the conductive layer to the gap. Still further, the method can comprise depositing a second resistive switching layer conformally overlying the first resistive switching layer and the portion of the conductive layer exposed by the gap, resulting in a second gap in the second resistive switching layer, wherein the second resistive switching layer is configured to permit diffusion of conductive particles within the second resistive switching layer. Additionally, the method can comprise forming a top electrode overlying the second resistive switching layer and filling the second gap, wherein the top electrode comprises the conductive particles and provides the conductive particles for diffusion within the second resistive switching layer in response to an electrical stimulus applied to the resistive switching device. In addition to the foregoing, the method can comprise forming an optional barrier layer overlying the top electrode and a hard mask material overlying the top electrode and optionally the optional barrier layer, forming and patterning a photoresist overlying the hard mask material and etching the hard mask, optional barrier layer, top electrode, second resistive switching layer and the first resistive switching layer, forming a discrete resistive switching device.

In another embodiment, the subject disclosure provides a method of forming a resistive switching device. The method can comprise forming a conductive metal layer overlying and in physical contact with a bottom electrode and with a dielectric layer in which the bottom electrode is situated, wherein the bottom electrode and dielectric layer overlie a substrate and forming a switching layer having a first thickness over the conductive layer, wherein the switching layer comprises a resistive switching material that is at least in part permeable to conductive particles. Further, the method can comprise forming a barrier layer overlying the switching layer that resists permeability of the conductive particles within the barrier layer, etching a gap in the barrier layer and exposing a portion of the switching layer to the gap and etching with a second etch the portion of the switching layer exposed to the gap in the barrier layer, and causing the portion of the switching layer to have a second thickness smaller than the first thickness of the switching layer. In addition, the method can comprise forming a top electrode overlying and in contact with both the barrier layer and the portion of the resistive switching layer and etching with a third etch the top electrode, the barrier layer and the switching layer to form a discrete resistive switching device.

In yet another embodiment, the method can comprise fabricating a resistive switching device. The method can comprise forming a conductive layer over a bottom electrode situated within a dielectric layer of a semiconductor substrate and forming a switching layer overlying and in physical contact with the conductive layer, wherein the switching layer comprises an electrically resistive material at least in part permeable to conductive particles. The method can also comprise forming a top electrode layer overlying and in physical contact with the switching layer, wherein the top electrode layer provides the conductive particles that drift into the switching layer in response to an electrical stimulus applied across the bottom electrode and the top electrode and forming a capping layer overlying the top electrode layer. The method can also comprise etching the capping layer, the top electrode layer and the switching layer to form a discrete resistive switching device, wherein the etching comprises a wet etch portion that chemically etches at least the switching layer resulting in an etched switching layer. In addition to the foregoing, the method can comprise passivating a perimeter of the etched switching layer or of the etched top electrode layer up to a depth within the resistive switching device and forming a passivated shell surrounding a core of the resistive switching device, wherein the passivated shell has an electrical resistance higher than the electrically resistive material of the switching layer and has lower permeability to the conductive particles than the electrically resistive material of the switching layer.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 17 illustrates a block diagram of an example etch for the deposition of FIG. 16, in an embodiment(s);

FIG. 20 depicts a flowchart of a sample method for fabricating a resistive switching device according to additional embodiments;

DETAILED DESCRIPTION

Introduction

Figure 1:
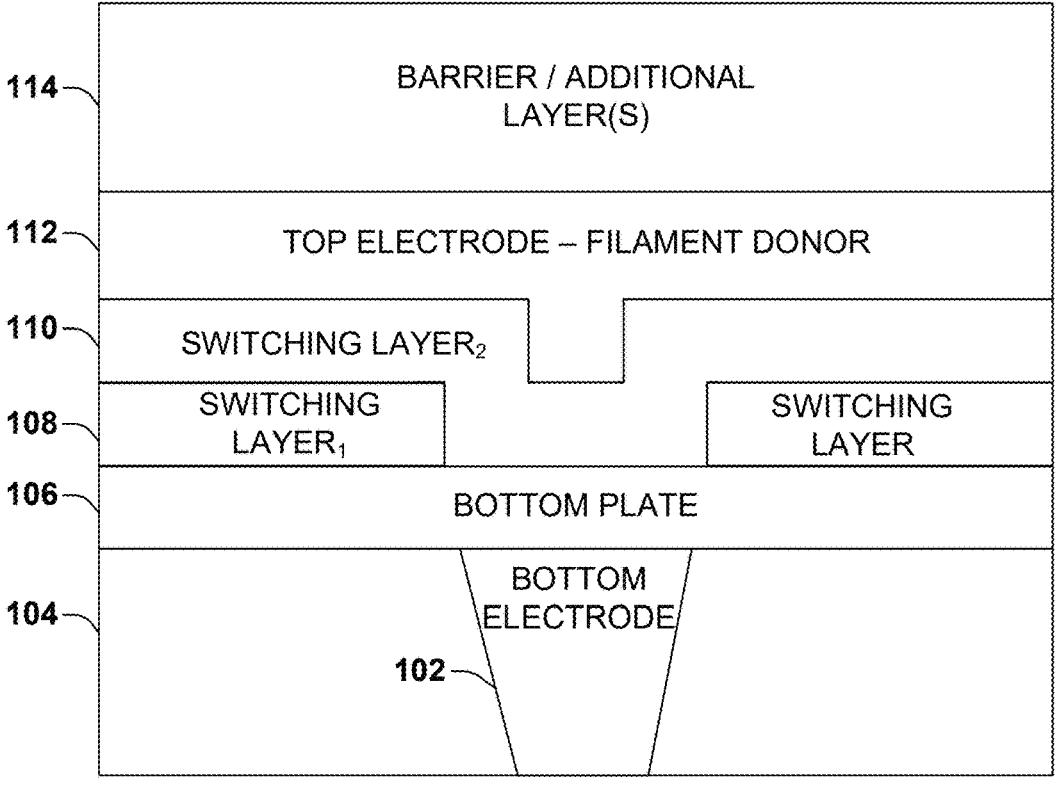
FIG. 1 depicts a block diagram of an example resistive memory cell deposition according to one or more disclosed embodiments.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a stoichiometric or non-stoichiometric silicon nitride (e.g., SiN, $Si_3N_4$, $SiN_x$, etc.), a Si sub-oxide (e.g., $SiO_x$ wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, a nitride (e.g., AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude (which can be lower than a formation magnitude of the external stimulus associated with forming the volatile conductive filament, e.g., in response to a current flowing through the selector device; see U.S. Pat. No. 9,633,724 B2 hereby incorporated by reference herein in its entirety and for all purposes). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: 0<x<2, 0<x<3, 0<x<4 or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_aN_b$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgO_y$, $TiO_y$, $AlO_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures, and are not intended to denote a same or similar value or ratio among the compounds. Mixtures can refer to non-stoichiometric materials with free elements therein-such as metal-rich nitride or oxide (metal-oxide/nitride with free metal atoms), metal-poor nitride or oxide (metal-oxide/nitride with free oxygen/nitrogen atoms)—as well as other combinations of elements that do not form traditional stoichiometric compounds as understood in the art. Some details pertaining to embodiments of the subject disclosure can be found in the following U.S. patent applications that are licensed to the assignee of the present application for patent: application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., Ion) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., Ion) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., Ioff) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s) of the subject disclosure are cognizant of two general conventions for arrangement of the memory cells. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array. In the 1TnR context, many individual memory cells having high device density in a given amount of silicon space can be connected to a single transistor that has much lower density. Accordingly, the 1TnR context facilitates higher bit densities for resistive memory cells on a semiconductor chip.

One example mechanism for connecting a 1T1R memory array includes a first terminal of a two-terminal resistive memory device connected to a drain of a transistor. A second terminal of the two-terminal resistive memory device can be connected to a bitline of the ITIR memory array. The source of the transistor is grounded or used as a source for erase or program signals, depending on erase/programming conditions for the memory array. Another example mechanism involves a three-terminal memory including a transistor coupled to a volatile two-terminal resistive switching device. A first terminal of the volatile RSD is connected to a gate of the transistor, and a second terminal of the volatile RSD is connected to a voltage source. When activated, the volatile RSD permits charge to accumulate at the gate of the transistor, and when deactivated can trap that accumulated charge at the transistor gate. Other resistive switching device (RSD) circuits can be utilized within the scope of the present disclosure.

Overview

FIG. 1 illustrates a block diagram of an example resistive memory device deposition 100 according to various embodiments of the present disclosure. The resistive memory device deposition includes an electrically conductive bottom plate 106 formed as a layer overlying a discrete bottom electrode 102 embedded within a dielectric layer 104. The conductive bottom plate 106 can be any suitable electrically conductive material, in various embodiments. Examples include doped semiconductor material (e.g., suitably doped silicon, polysilicon, silicon germanium, and so forth), as well as a conductive metal, a conductive compound, alloy, mixture, and so forth. As examples, conductive bottom plate 106 can include W, TiN, TaN, and others. In at least one embodiment, conductive bottom plate 106 can be a W metal with a flat upper surface as oriented in the illustration of FIG. 1 (see also, e.g., U.S. Pat. No. 10,522,754 incorporated by reference hereinabove).

In one or more embodiments, conductive bottom plate 106 can have a thickness in a range from about 50 angstroms (Å) to about 500 Å. As utilized herein, the term "about", "approximately" and other relative terms when utilized to modify a numerical description of a disclosed structure, refer to suitable ranges about the given number that would achieve the same or similar functions as described for the disclosed structure. Where such ranges are not explicitly disclosed, a range within typical manufacturing tolerances understood by one of ordinary skill in the art can be implied. Alternatively, a range of between 1 and 5% or between 1 and 10% the stated number can be implied, in some embodiments, or a range that would be understood by one of ordinary skill in the art to be suitable to achieve the stated functions and characteristics of the disclosed structure can be implied in other embodiments. Relative terms utilized for qualitative (rather than quantitative) description can be understood to imply explicitly stated alternatives or variations, variations understood in the art to achieve the function or purpose described for a particular component or process, or a suitable combination of the foregoing.

Resistive memory device deposition 100 includes a first switching layer (which can also be called a sacrificial switching layer) 108 and a second switching layer 110 constructed to localize a filament formed within a resulting resistive switching memory device to a core (e.g., near a center) of the resistive switching memory device. As an illustrative contrast, take the general case of a resistive memory deposition having a single electrically insulating switching layer—that is permeable to conductive particles—in contact with an electrically conductive bottom plate 106 (e.g., see FIG. 3, infra). A filament structure of the conductive particles can form through the electrically insulating switching layer wherever good electrical conductivity and electric field strength are present. This condition is generally met where good surface continuity between the electrically insulating switching layer and the electrically conductive bottom plate 106 exists. For the deposition of FIG. 3, good surface continuity can be observed throughout the shared surface of switching layer 308 and bottom plate 206. However, a problem can occur for a discrete etched device (e.g., see FIG. 17, infra) having surface impurities, chemical etch byproducts or the like at a perimeter or exterior surface of the discrete etched device, resulting from an etch process. For instance, a filament that forms near surface impurities or etch byproducts at the perimeter of the discrete device can be compromised due to the surface or material impurities resulting from the etch. The compromised filament can cripple the anticipated performance characteristics of the switching device, create non-uniformity among different cells on a die or among different die in a wafer, reduce cell longevity, prevent proper reverse-switching resulting in a short, or other problems. Embodiments of the present disclosure provide resistive switching devices and means for fabricating such devices that confine filament formation to a core or center of the resistive switching device, where materials are more pure and etch effects at a perimeter of a switching device have reduced or no impact on the conductive filament. These embodiments can therefore enhance device performance, uniformity and overall efficacy.

In various embodiments, first switching layer 108 can be constructed to resist drift or diffusion of conductive particles within first switching layer 108 (e.g., general permeability of the conductive particles within the first switching layer 108), as compared to second switching layer 110. For instance, first switching layer 108 can be more structurally dense than second switching layer 110. This design is provided to mitigate or avoid formation of a conductive filament within first switching layer 108, and confine the filament to second switching layer 110. In an embodiment(s), first switching layer 108 can be formed with an atomic layer deposition process. As one example, the atomic layer deposition process can create a stoichiometric composition for first resistive switching layer 108. In further embodiments, second switching layer 110 can be formed to permit drift or diffusion of conductive particles therein. Second switching layer 110 can be formed of a physical vapor deposition process, in an embodiment. As a further example, the physical vapor deposition process can create a non-stoichiometric composition for second resistive switching layer 110. In at least one embodiment, first switching layer 108 and second switching layer 110 can comprise the same material(s). As one example, though not limiting, first switching layer 108 can comprise a material in stoichiometric form and second switching layer 110 can also comprise the material in non-stoichiometric form. In other embodiments, first switching layer 108 and second switching layer 110 can be formed in part of different materials and in part of a common material(s), or can be formed entirely of different materials.

As illustrated in FIG. 1, a gap in first switching layer 108 allows second switching layer 110 to contact (or come close to contacting) conductive bottom plate 106. By utilizing a material or process that causes a preferential formation of a conductive filament within second switching layer 110, first switching layer 108 can serve as a boundary or blocking region confining filament formation to the region where second switching layer 110 is adjacent to conductive bottom plate 106. Accordingly, when a resistive switching device is etched from resistive memory deposition 100 (see FIGS. 8 and 9, infra), the filament will be away from an exterior of the resistive switching device and not corrupted by byproducts of the device etch.

Further to the above, resistive memory deposition 100 includes a top electrode-filament donor layer 112 overlying the second switching layer 110. Top electrode-filament donor layer 112 can be a source of the conductive particles that form a conductive filament within second switching layer 110 (e.g., an active metal layer, and so forth). Additionally, a barrier layer 114 and optionally one or more additional layers, which can include an adhesion layer(s), ion conduction layer(s), passivation layer(s), diffusion mitigation layer(s), and so forth, can be provided over top electrode-filament donor layer 112.

Figure 2:
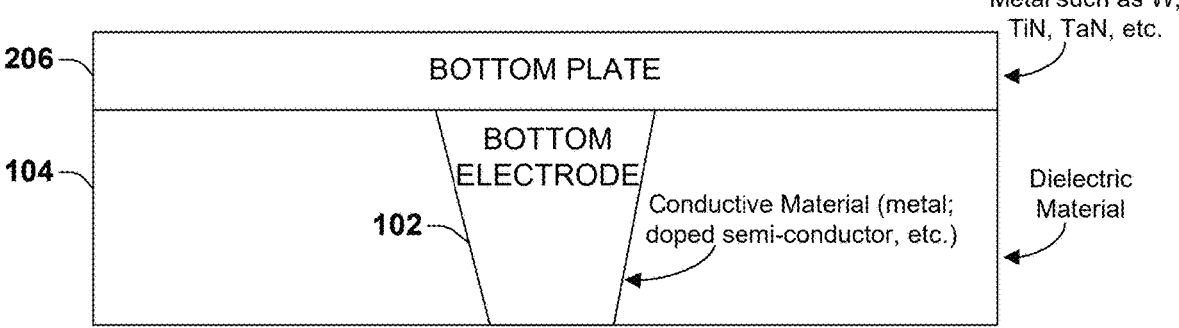
FIGS. 2-7 illustrate block diagrams of steps in depositing the example resistive memory cell of FIG. 1.

FIGS. 2-7 depict the resistive memory deposition 100 of FIG. 1 in more detail. As illustrated in FIG. 2, a bottom plate layer 206 is formed overlying bottom electrode 102 and dielectric layer 104. In various embodiments, dielectric layer 104 can comprise any suitable non-conductive dielectric material, such as a silicon material, a silicon oxide material, or the like. Bottom electrode 102 can comprise a conductive material, such as a metal, a conductive metal compound, metal alloy, metal mixture, etc., or a doped semi-conductor, or the like or a suitable combination of the foregoing.

Figure 3:
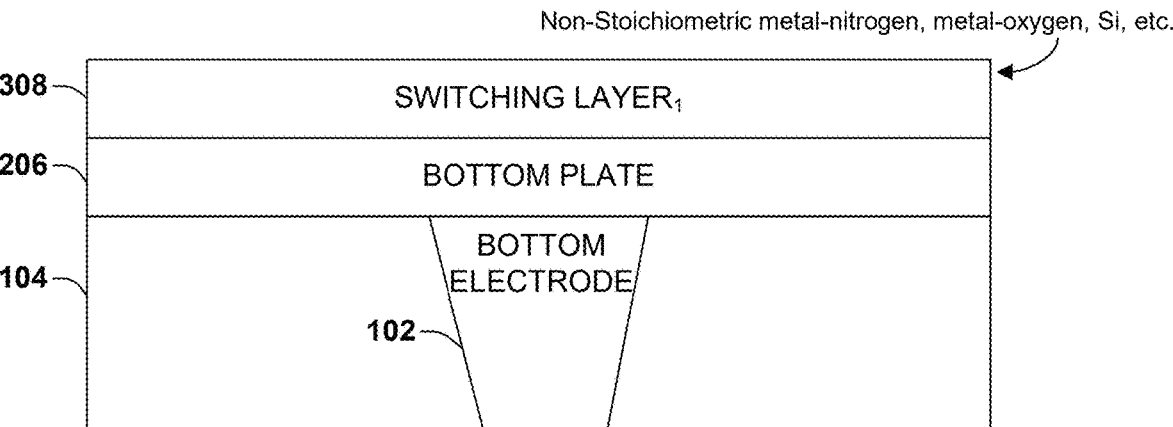

Referring to FIG. 3, a first switching layer 308 is formed overlying bottom plate layer 206. First switching layer 308 can comprise a metal-nitrogen material, a metal-oxygen material, a silicon material, a silicon compound, or the like. In an embodiment, first switching layer 308 can be a stoichiometric composition of any of the foregoing. In another embodiment, first switching layer 308 can be deposited utilizing an atomic layer deposition process. In at least one embodiment, first switching layer 308 can be formed of an AlOx or AlNx material, a HfOx material, or the like, or a suitable combination of the foregoing, where x is a suitable stoichiometric value (or non-stoichiometric value, in at least one embodiment).

Figure 4:
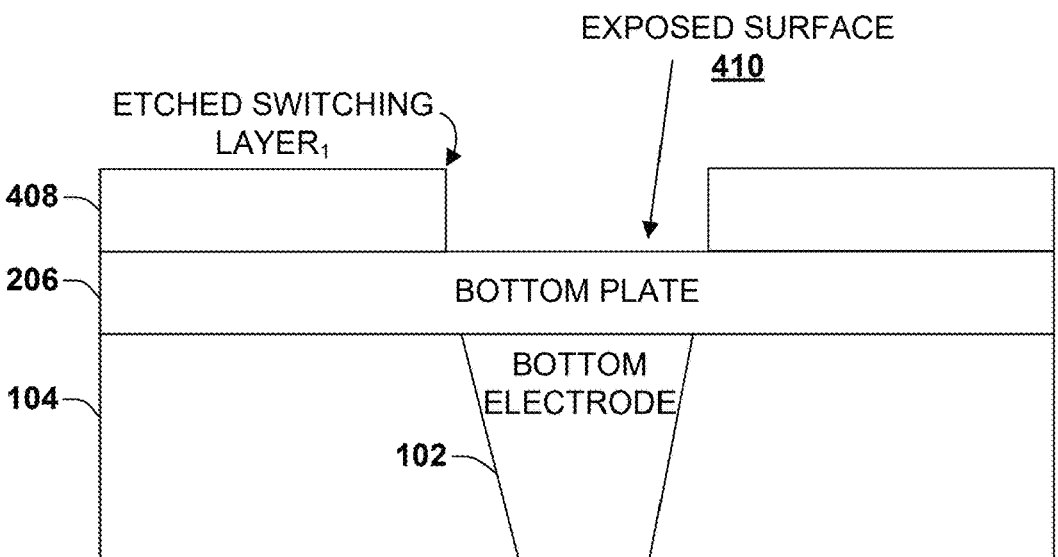

As illustrated in FIG. 4, a gap can be formed in the first switching layer 308 to form an etched first switching layer 408. The gap can be a damascene process, in an embodiment, a chemical etch in another embodiment, or a physical etch in still further embodiments. In at least one embodiment, the gap can expose a surface 410 of bottom plate layer 206 to the gap. However, in alternative embodiments, a very thin layer (e.g., a few angstroms to two nanometers) of first switching layer 308 can remain overlying bottom plate layer 206, and in still further embodiments, the gap can non-uniformly expose the surface of bottom plate layer 206 such that islands of first switching layer 308 still cover patches of the exposed surface 410 of bottom plate layer 206.

Figure 5:
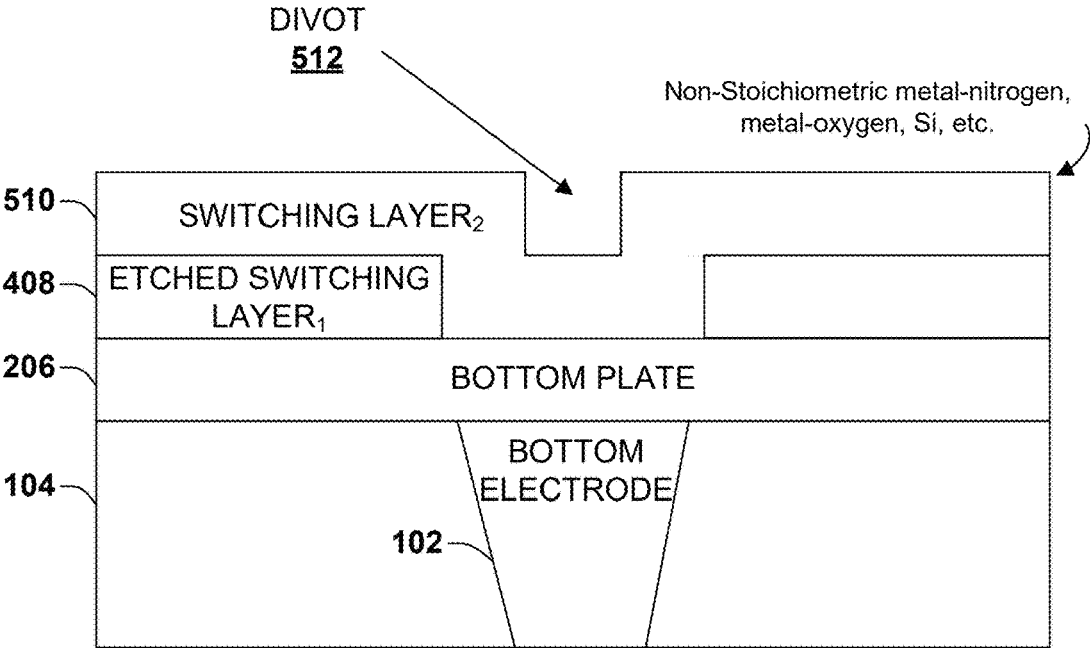

With reference to FIG. 5, a second switching layer 510 is formed overlying etched first switching layer 408 and exposed surface 410 of bottom plate layer 206. Second switching layer 510 can be formed from a physical vapor deposition process in various embodiments. In some embodiments, second switching layer 510 can be formed as a non-stoichiometric composition that is at least in part permeable to electrically conductive particles (e.g., ions, atoms, molecules, etc.). As a particular example, second switching layer 510 can be formed as a non-stoichiometric composition that is at least in part permeable to electrically conductive particles of a top electrode (e.g., see FIG. 6, infra). Examples of suitable materials for second switching layer 510, though not exhaustive, can include $SiO_x$, amorphous Si, Si, $TiO_x$, $AlO_x$, $HfO_x$, $NiO_x$, $TaO_x$, $NbO_x$, $ZnO_2$, $ZrO_x$, $GdO_x$, a metal-nitrogen (e.g., $AlN_x$) or the like, or a suitable combination of the foregoing. X is a suitable value defining a stoichiometric or a non-stoichiometric composition depending on respective characteristics of the afore-mentioned compounds as stoichiometric and non-stoichiometric structures or mixtures to achieve the above-mentioned functions of switching matrix 108. For instance, where one of ordinary skill might understand non-stoichiometric $AlO_x$ to be suitable to permit drift or diffusion of conductive particles and form a non-volatile filament of such particles therein in response to a stimulus, 'x' can have a value or range of values suitable to achieve such non-stoichiometric composition of $AlO_x$. In contrast, where another compound permits drift or diffusion of conductive particles and formation of a filament of such particles as a stoichiometric compound, 'x' can have a value or range of values suitable to achieve a stoichiometric composition of such other compound. Where yet another compound permits drift or diffusion of conductive particles and formation of a filament of such particles as a non-stoichiometric compound and as a stoichiometric compound then 'x' can have a value(s) or range(s) of values suitable to achieve such non-stoichiometric and stoichiometric compositions.

Based on how deeply etched first switching layer 510 is etched, second switching layer 510 can be in physical contact with bottom plate layer 206, partially in physical contact with bottom plate layer 206, or not in physical contact with bottom plate layer 206. For instance, where a thin layer (e.g., a few angstroms to a couple nanometers) of etched first switching layer remains overlying exposed surface 410, second switching layer 510 will not be in physical contact with bottom plate layer 206. In some embodiments, where islands of first switching layer 308 still cover patches of the exposed surface 410 of bottom plate layer 206 second switching layer 510 can partially be in physical contact with bottom plate layer 206. In contract, where exposed surface 410 is fully clear of first switching layer 308, then second switching layer 510 can be in physical contact with bottom plate layer 206 throughout exposed surface 410.

As illustrated by FIG. 5, second switching layer 510 can have a divot 512 in a top surface of second switching layer 510. Divot 512 can result from forming second switching layer 510 to fill the gap etched in etched first switching layer 408. Any post deposition cleaning or processing of second switching layer 510, such as a CMP or other process to flatten a top surface (away from divot 512) of second switching layer 510, or surface preparation that removes impurities on top of second switching layer 510 can be implemented to retain divot 512.

Figure 6:
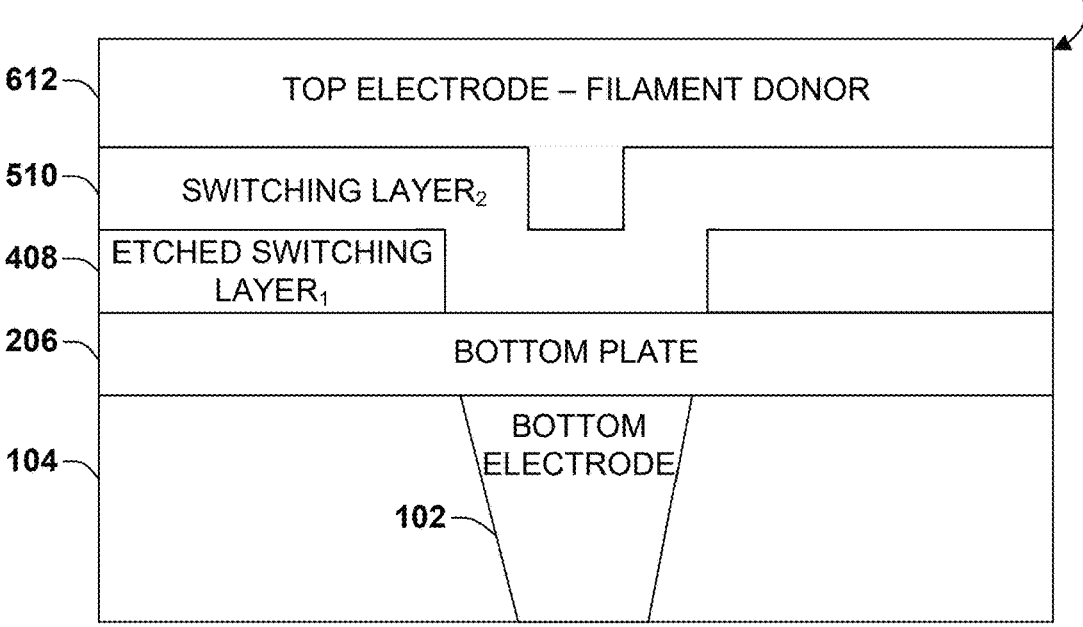

Referring to FIG. 6, a top electrode—filament donor layer 612 is deposited overlying second switching layer 510. Top electrode—filament donor layer 612 fills divot 512 overlying the exposed surface 410 of bottom plate layer 206. This brings the region of top electrode—filament donor layer 612 that is within divot 512 closer to bottom plate layer 206 only within the exposed surface 410 region of bottom plate layer 206. This shortened distance between top electrode—filament donor layer 612 and bottom plate layer 206, in response to a voltage applied across bottom electrode 102 and top electrode—filament donor 612, results in an increased electric field in the exposed surface 410 region of bottom plate layer 206. In turn, this increased electric field causes a preferential formation of conductive ions of top electrode-filament donor 612 within this exposed surface 410 region of bottom plate layer 206, mitigating or avoiding formation of a conductive filament of the conductive ions outside of the exposed surface 410 region of bottom plate layer 206 (e.g., see FIG. 9, infra). This confines formation of the conductive filament to a core of a resistive memory device.

In various embodiments, top electrode—filament donor 612 can be selected from a material that comprises particles capable of being ionized e.g., in response to an electric field, a voltage, a current, a suitable temperature, or the like, or a suitable combination of the foregoing. Moreover, the material can be selected to comprise particles that, in addition to being capable of being ionized, are at least in part permeable to a material of second switching layer 510. In response to a suitable physical stimulus (e.g., electric field, voltage, current, temperature, or the like, or a suitable combination of the foregoing) the (ionized) conductive particles drift into second switching layer 510 from top electrode—filament donor layer 612 to form a conductive filament within second switching layer 510, to effect resistive switching as described herein or known in the art. In some examples, the material of top electrode—filament donor 612 can comprise a non-stoichiometric (or stoichiometric, where suitable) metal-nitrogen material, an Al material, an Al metal, a non-stoichiometric $AlN_x$, a stoichiometric or non-stoichiometric $AlNO_x$, TIN, Ti, W or the like, or a suitable combination of the foregoing.

In still other embodiments, a metal (e.g., Al) or a metal-nitrogen (or metal oxide), such as a nitrogen poor metal nitride or nitrogen rich metal nitride, utilized for top electrode-filament donor 612 can have a Si dopant in the metal material of less than 2% Si by atomic weight. Thus, for example, an aluminum metal or a metal-nitrogen material comprising $AlN_x$ can also comprise 2% or less Si by atomic weight (e.g., between about 0.5% and about 1% in an embodiment). The silicon doping can be implemented by including less than 2% silicon by atomic weight into a sputtering target comprising the metal of the metal-nitrogen. While the silicon doped metal is deposited on top of switching matrix 108, nitrogen gas is provided to the resistive memory device deposition 100 during the depositing of the silicon doped metal to form the metal-nitrogen with silicon doping. In one or more embodiments, the Si dopant can likewise be provided for second switching layer 510 or first switching layer 308, or both. In still further embodiments, the Si dopant can be provided for other switching layers or top electrodes disclosed herein, where suitable.

Figure 7:
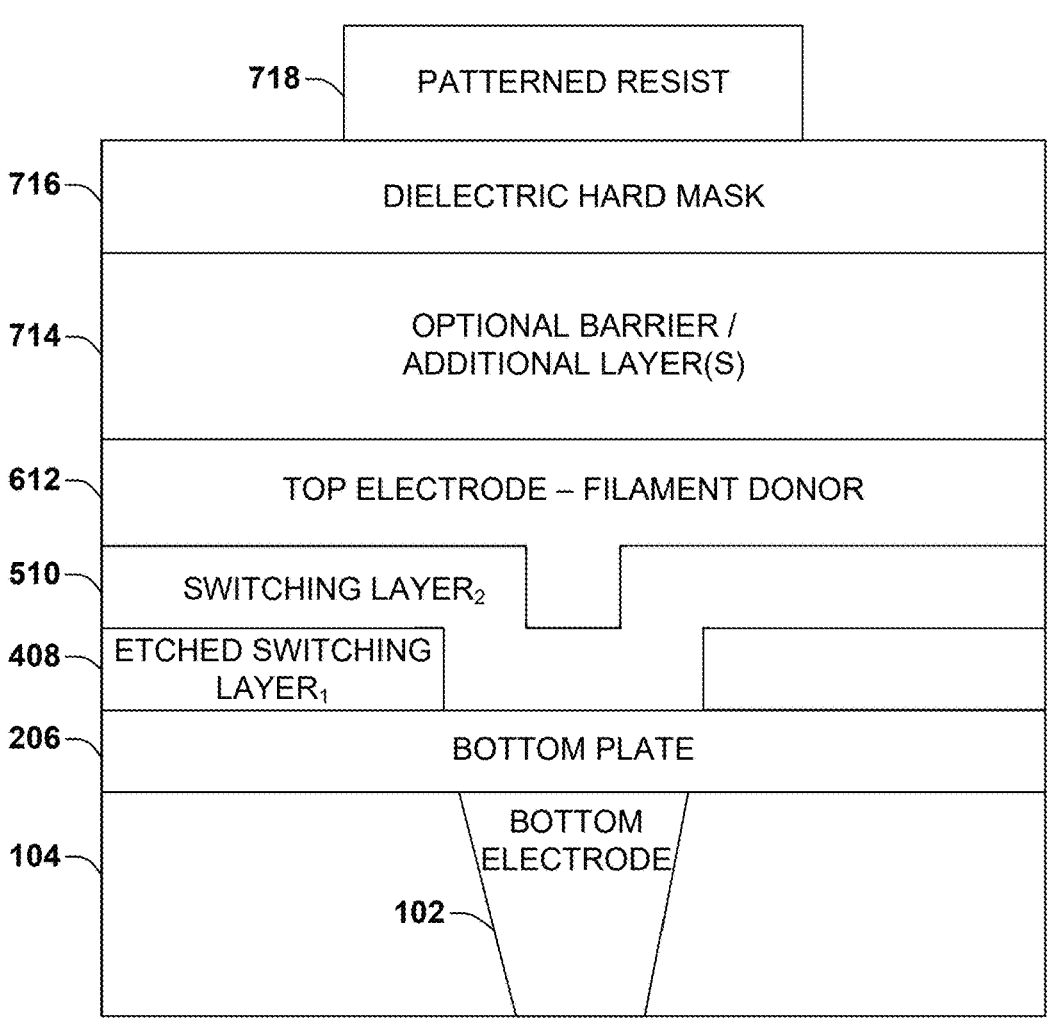

FIG. 7 illustrates a deposition 700 of one or more optional layers overlying top electrode-filament donor layer 612. Optional barrier/additional layer(s) 714 are depicted, which can be excluded in some embodiments. Optional barrier/additional layer(s) 714 can include a barrier layer selected from a material that resists permeability of conductive particles of top electrode-filament donor layer 612, in an embodiment. In other embodiments, the barrier layer can comprise a material that resists permeability of oxygen or other reactant gases or plasmas utilized in semiconductor fabrication, that resists permeability of atmospheric gas(es), that resists chemical combination with one or more etching materials utilized in the semiconductor fabrication, or the like. In some embodiments, the barrier layer can be selected from a material comprising TIN, Ti, W, TaN, or the like, or a suitable combination of the foregoing. Optional additional layer(s) can include one or more of: an adhesion layer(s), an etch stop layer(s), a passivation layer(s), a seed layer(s), a dielectric layer(s), a conductive plug layer(s), or other suitable layer known in the art, or a suitable combination of the foregoing. A dielectric hard mask 716 can be provided over the optional barrier/additional layer(s) 714. In an embodiment, dielectric hard mask 716 can comprise a material selected from $SiO_2$, SiN, SiC, $SiO_N$, amorphous carbon or the like, or a suitable combination of the foregoing. Additionally, a patterned photoresist 718 can overlie dielectric hard mask 716, as is known in the art.

Figure 8:
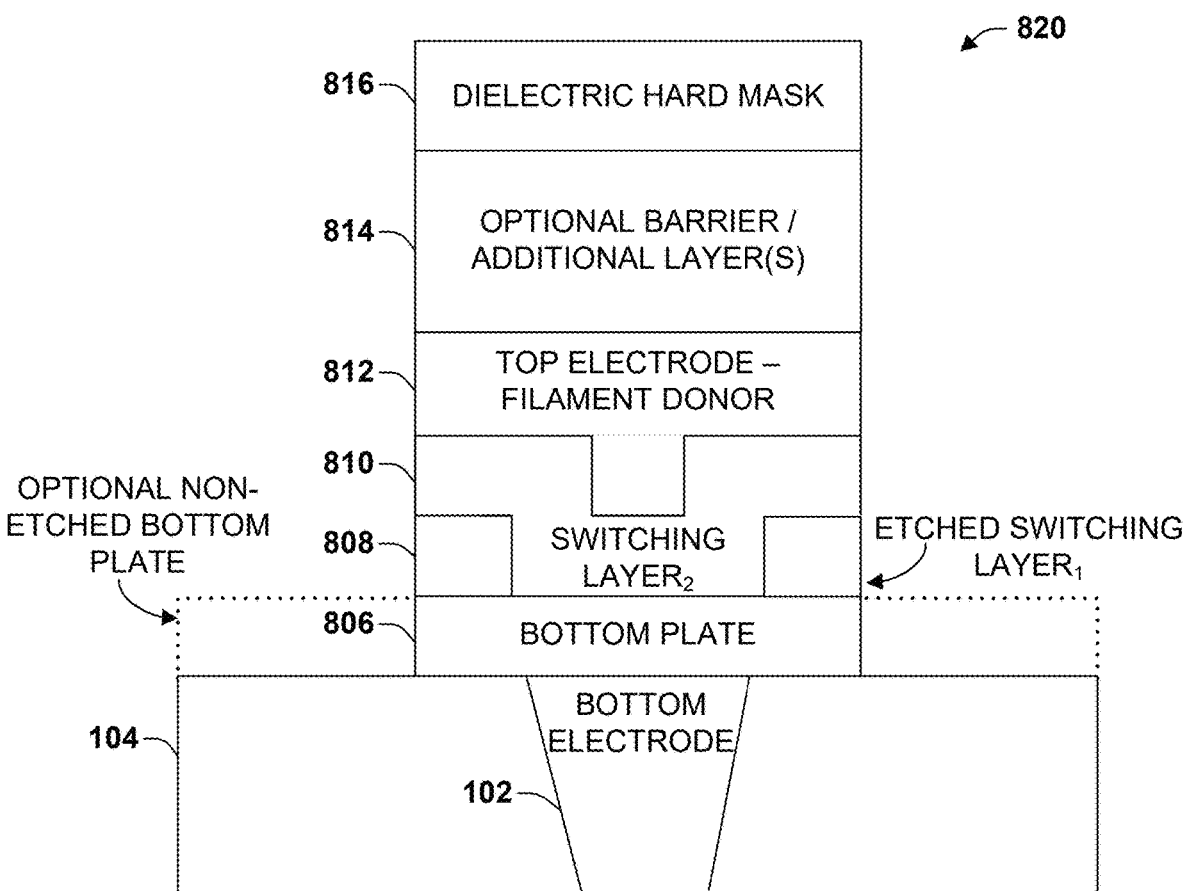
FIG. 8 depicts a block diagram of an example etch for forming a resistive memory cell having filament formation confined near a core of the device, in an embodiment(s)

FIG. 8 depicts a block diagram of an example resistive device etch and pattern removal 800. One or more etch processes can comprise etching dielectric hard mask 716, optional barrier/additional layer(s) 714, top electrode-filament donor layer 612, second switching layer 512, and etched first switching layer 408. In some embodiments, the one or more etch processes can also etch bottom plate layer 206 to form etched bottom plate 806, although in other embodiments bottom plate layer 206 is not etched and an optional non-etched bottom plate remains as depicted by the dotted lines in FIG. 8.

In various embodiments, resistive device etch and pattern removal 800 can comprise a first etch process to etch dielectric hard mask 716 and form etched dielectric hard mask 816. The first etch process can stop on optional barrier/additional layer(s) 714 in an embodiment, or can etch one or more of barrier/additional layer(s) 714 to form etched optional barrier/additional layer(s) 814. Where optional barrier/additional layer(s) 714 are not present, the first etch process can stop on top electrode-filament donor layer 612. Where the first etch process stops on (one or more of) optional barrier/additional layer(s) 714, a second etch can be utilized to remove a remainder of optional barrier/additional layer(s) 714 and stop on top electrode-filament donor layer 612.

The first etch process can be a plasma etch utilizing a gas selected from a group consisting of: $C_4F_8$, $C_4F_6$, $CHF_3$, $CF_4$, CO, $O_2$, $N_2$ and Ar in at least one disclosed embodiment. Subsequently, an optional photoresist (PR) strip/post etch clean can be implemented. In an embodiment, the PR strip (to remove patterned photoresist following the first etch process) can utilize an $O_2$ ash, an $O_2/CF_4$ ash or the like, or a suitable combination of the foregoing. An optional clean process to remove debris or remnants from the removal of the PR strip or prepare a stop surface of etched dielectric hard mask 816 or subsequent surface of optional barrier/additional layer(s) 714 or top electrode-filament donor layer 612 for further etching can be implemented. The optional clean process can employ a dimethyl sulfoxide (DMSO) rinse, an EKC rinse, a hydrogen fluoride (HF) clean, a deionized (DI) water rinse or the like, or a suitable combination of the foregoing.

A second etch process can be implemented to etch additional material layers following the first etch process and optional PR strip/first etch clean. The second etch process can utilize etched dielectric hard mask 816 as a mask for the second etch process. The second etch process can optionally etch any remaining optional barrier/additional layer(s) 714 (if present) to optionally form etched optional barrier/additional layer(s) 814. Regardless of optional barrier/additional layer(s) 714, the second etch process can etch top electrode-filament donor layer 612 to form an etched top electrode 812, can etch second switching layer 510 to form an etched second switching layer 810, can etch the previously etched first switching layer 408 to form a further etched first switching layer 808. The second etch process can etch bottom plate layer 206 in an embodiment, or a third etch process can etch bottom plate layer 206 in another embodiment, or bottom plate layer 206 can remain unetched in still another embodiment. The second etch can be a plasma etch utilizing a gas selected from a group consisting of: $Cl_2$, $BCl_3$, HBr, Ar, $N_2$, He, $O_2$, $CHF_3$, $CF_4$, and $SF_6$. A post etch clean utilizing $O_2$ ash, a dilute HF, an ultra-dilute HF, an EKC clean, sulfuric peroxide mixture (SPM) rinse, a $H_2O_2$ rinse, a tetramethylammonium hydroxide (TMAH) rinse, a DI water rinse, or the like, or a suitable combination of the foregoing can optionally be utilized to complete the second etch process.

Following completion of resistive device etch and pattern removal 800 a discrete resistive switching device 820 is formed. The discrete resistive switching device 820 can be configured to have multiple resistance states as measured between etched top electrode 812 (or etched hard mask 816, depending on embodiment) and bottom electrode 102. The multiple resistance states include a high resistance state in which no conductive filament provides electrical continuity between etched top electrode 812 and etched bottom plate 806, through etched second switching layer 810. The multiple resistance states also include a low resistance state in which a conductive filament forms within etched second switching layer 810 between etched top electrode 812 and etched bottom plate 806.

Figure 9:
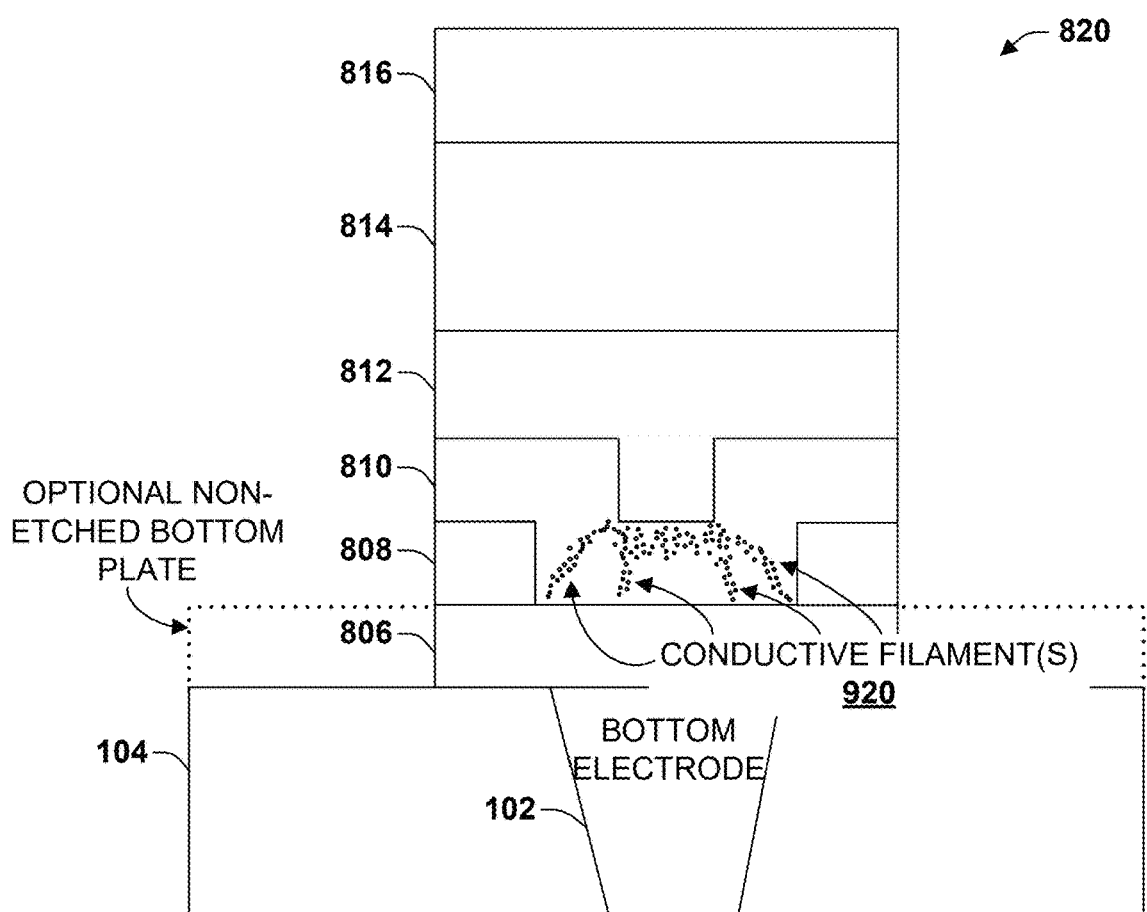
FIG. 9 illustrates a block diagram of example filament formation for a disclosed resistive memory cell, in an embodiment.

FIG. 9 depicts a block diagram of an example filament formation 900 for the discrete resistive switching device

820. Example conductive filaments 920 are illustrated that represent example paths of conductive particles from etched top electrode 812 to etched bottom plate 806. The filament(s) 920 can form from conductive particles or groups of particles from etched top electrode 812 drifting within etched second switching layer 810 in response to a suitable stimulus (or stimuli) applied to discrete resistive switching device 820. Upon formation of an electrical filament(s) 920 establishing sufficient electrical continuity between etched top electrode 812 and etched bottom plate 806, discrete resistive switching device 820 enters a low resistance mode. In response to a second electrical stimulus (e.g., an opposite polarity, or different field, current, voltage, temperature, or the like, or combination) the electrical filament(s) 920 can deform (e.g., by dispersion of conductive particles forming the filament(s) or drift of conductive particles away from etched bottom plate 806) sufficient to break electrical continuity of the electrical filament(s) 920, causing the discrete resistive switching device 820 to enter a high resistance mode.

Figure 10:
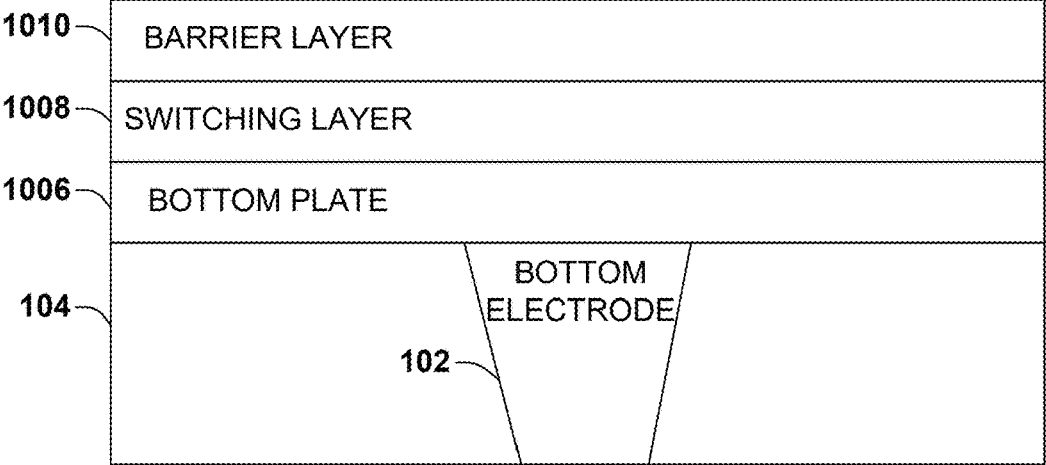
FIG. 10 depicts a block diagram of an example deposition for lower layers of a resistive memory cell, in further embodiments.

FIG. 10 illustrates a block diagram of a bottom plate, switching layer and barrier layer deposition 1000 according to further embodiments of the present disclosure. A bottom electrode 102 is formed within a dielectric layer 104, as disclosed elsewhere herein or known in the art. A bottom plate layer 1006 is formed overlying the bottom electrode 102 and dielectric layer 104. In some embodiments, one or more optional layers can be formed between bottom electrode 102 and dielectric layer 104, and bottom plate layer 1006. The one or more optional layers can include an adhesion layer(s), a seed layer(s), a conductive layer(s), or the like, or a suitable combination. In other embodiments, bottom plate layer 1006 can be in direct physical contact with bottom electrode 102 and dielectric layer 104. A resistive switching layer 1008 is formed overlying bottom plate layer 1006, and a barrier layer 1010 is formed overlying resistive switching layer 1008.

Figure 11:
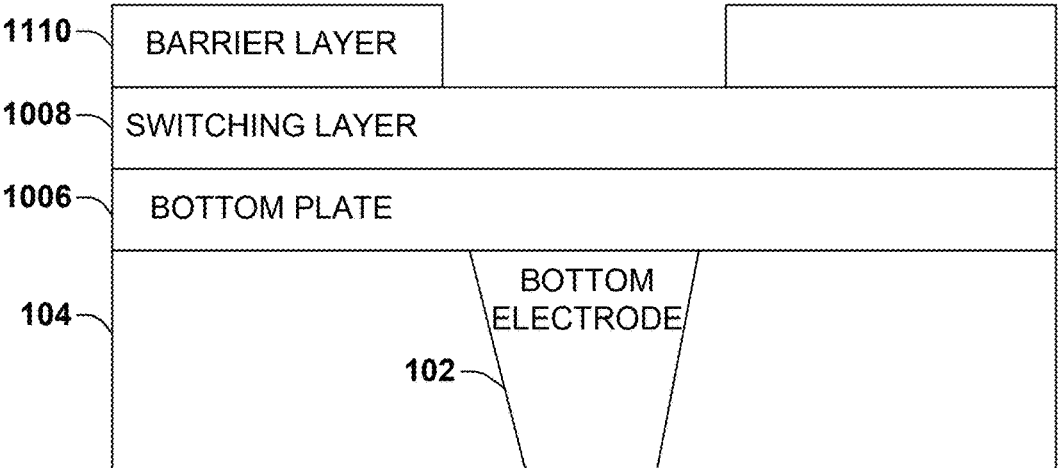
FIG. 11 illustrates a block diagram of an example central barrier layer etch according to further disclosed embodiments.
Figure 12:
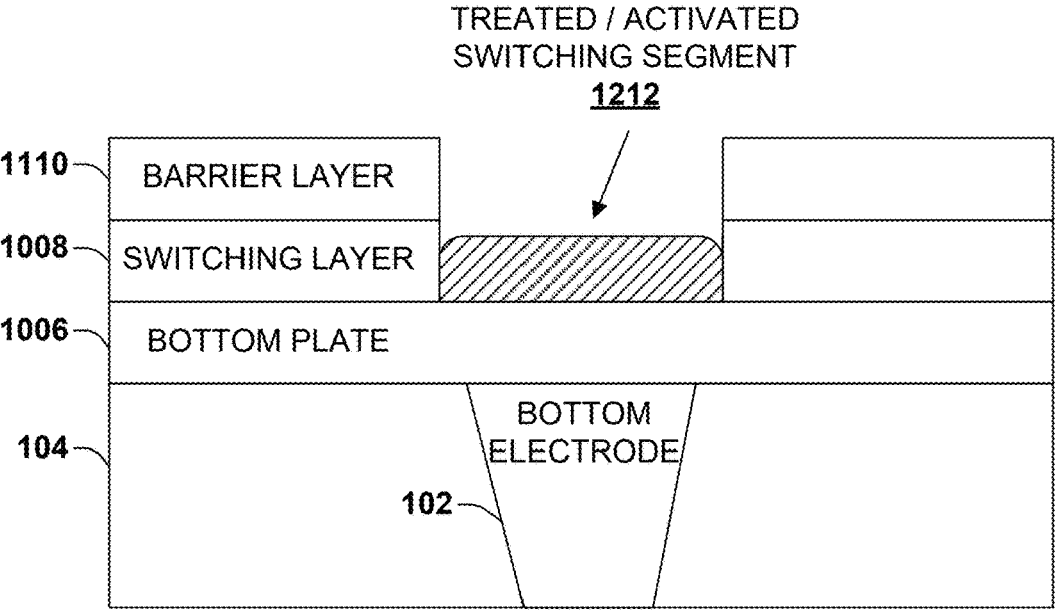
FIG. 12 depicts a block diagram of a treatment process for a central switching layer exposed by the central barrier layer etch of FIG. 11 in some embodiments.

FIG. 11 illustrates a barrier layer etch 1100 that forms a gap within barrier layer 1010, exposing a surface of switching layer 1008 to the gap. Barrier layer etch 1100 results in an etched barrier layer 1110. FIG. 12 depicts a controlled etch/treatment process 1200 to form a treated/activated switching segment 1212. Controlled etch/treatment process 1200 can be configured to increase likelihood of conductive filament formation within treated/activated switching segment 1212. In one embodiment, controlled etch/treatment process 1200 can remove a portion of switching layer 1008 causing treated/activated switching segment 1212 to be thinner, thereby enhancing electric field density within treated/activated switching segment 1212 in response to a voltage. In another embodiment, controlled etch/treatment process 1200 can improve permeability of conductive particles within treated/activated switching segment 1212 compared to surrounding areas of switching layer 1008 to increase likelihood of filament formation within treated/ activated switching segment 1212. Improved permeability can be effected, for example, by decreasing density of treated/etched switching segment 1212, suitable doping of treated/etched switching segment 1212 (e.g., with ion donor material(s)), light particle bombardment of treated/activated switching segment 1212, or the like, or a suitable combination of the foregoing.

Figure 13:
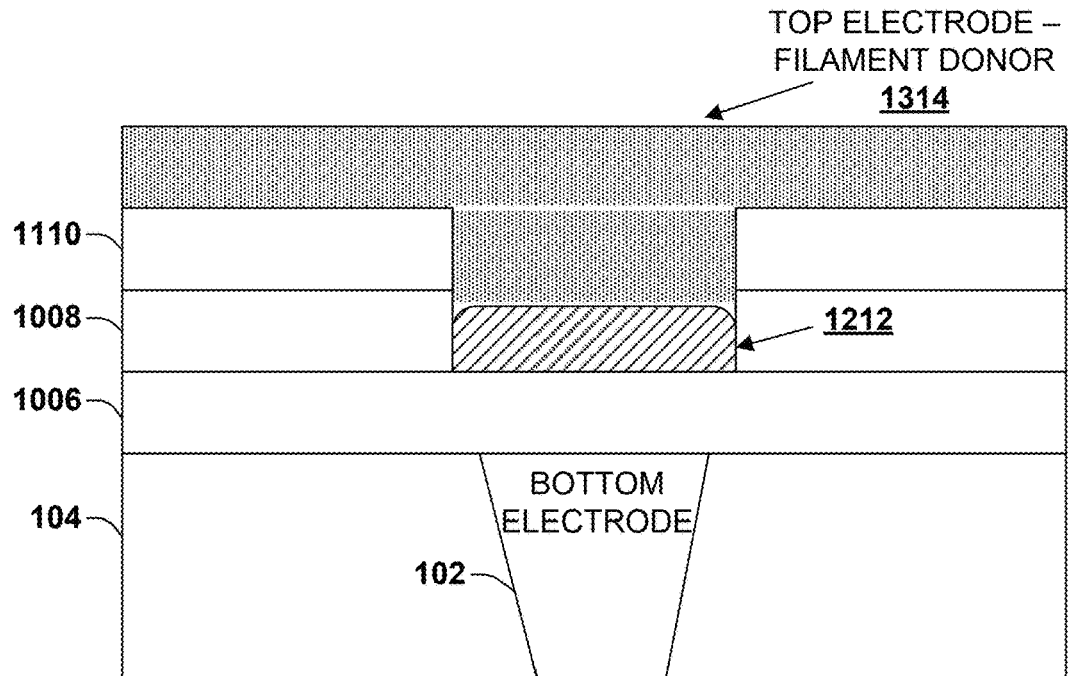
FIG. 13 illustrates a block diagram of a top electrode deposition overlying the barrier layer and central switching layer of FIG. 12 according to other embodiments.
Figure 14:
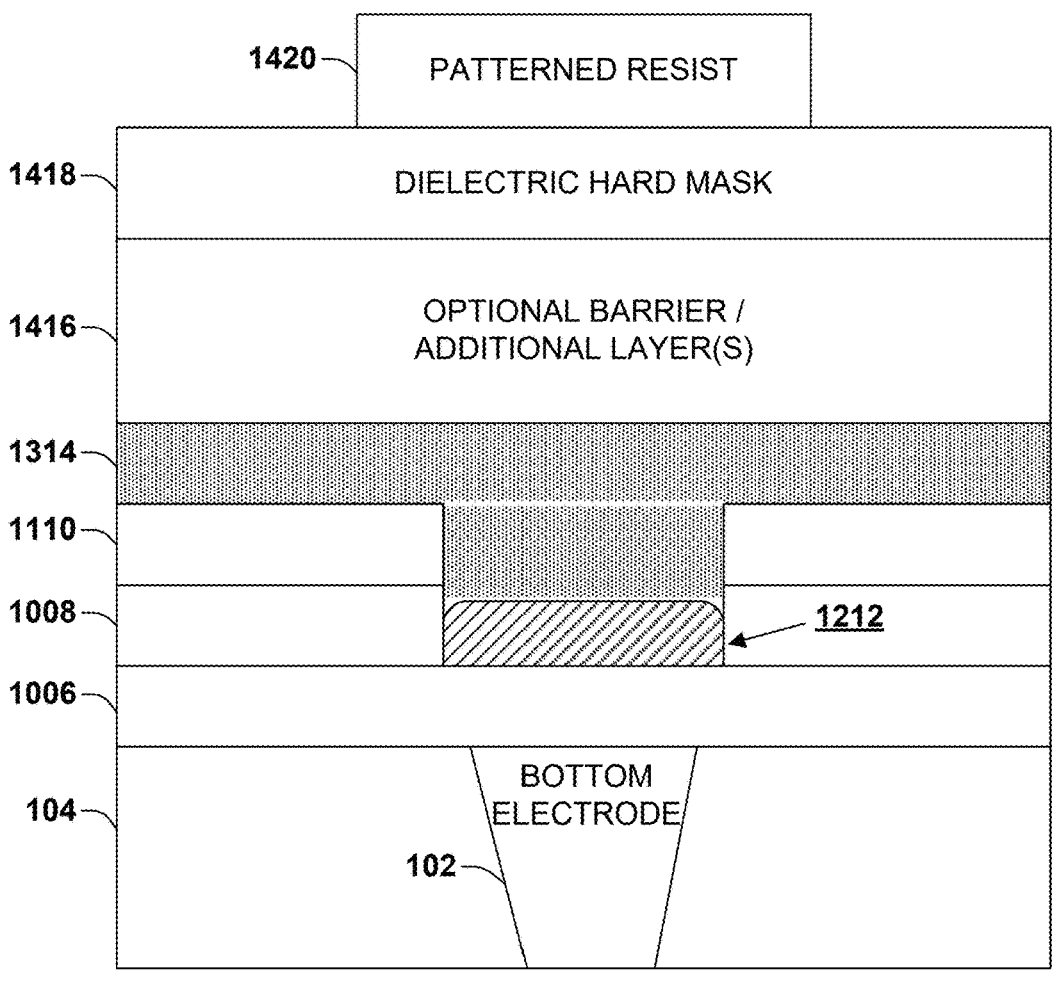
FIG. 14 depicts a block diagram of upper layer deposition overlying an activated central switching layer, in further embodiments.

As illustrated by FIG. 13, a top electrode—filament donor layer 1314 can be deposited overlying etched barrier layer 1110. Top electrode—filament donor layer 1314 is in physical contact with etched barrier layer 1110 and with treated/ etched switching segment 1212. Top electrode—filament donor layer 1314 can be formed of a material that provides conductive particles to treated/etched switching segment 1212, as described herein or known in the art. FIG. 14 illustrates formation of an optional barrier/additional layer(s) 1416, a dielectric hard mask layer 1418 and a patterned photoresist 1420. These layers can be as described throughout this disclosure, or as known in the art.

Figure 15:
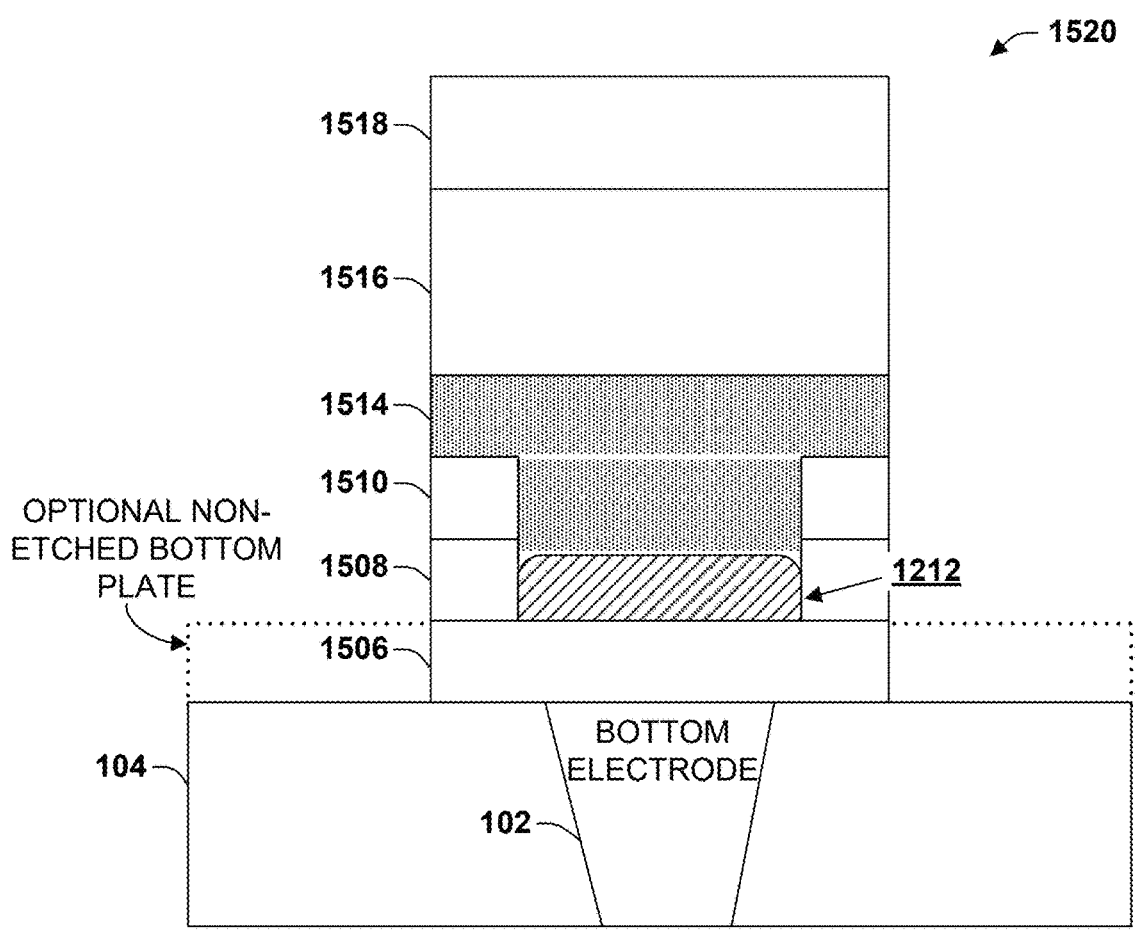
FIG. 15 illustrates a block diagram of a resistive memory cell etch for forming a discrete resistive device, in an embodiment.

FIG. 15 depicts a resistive device etch and resist removal 1500 for the stack of material layers of FIG. 14, according to further disclosed embodiments. Resistive device etch and resist removal 1500 can utilize two or more etch processes to form a discrete resistive device 1520 as illustrated. Particularly, resistive device etch and resist removal 1500 can form an etched dielectric hard mask 1518, optionally an etched barrier/additional layer(s) 1516 (where present), an etched top electrode 1514, an etched barrier layer 1510 and an etched resistive switching layer 1508. In some embodiments, resistive device etch and resist removal 1500 can etch bottom plate layer 1006 to form etched bottom plate 1506. In other embodiments, resistive device etch and resist removal 1500 can stop on bottom plate layer 1006 and an optional non-etched bottom plate can remain, as illustrated by dotted lines.

Figure 16:
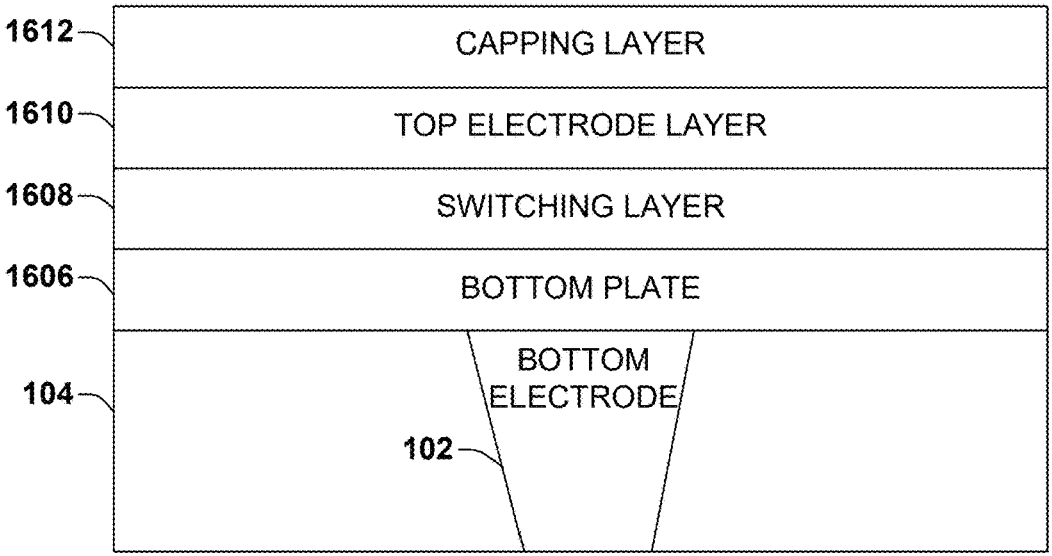
FIG. 16 depicts a block diagram of an example deposition for a resistive memory cell according to further embodiments of the present disclosure.

FIG. 16 depicts a bottom plate, switching layer, top electrode and capping layer deposition 1600, according to still further embodiments of the present disclosure. As illustrated, a bottom plate layer 1606 is provided overlying a bottom electrode 102 and dielectric layer 104. In some embodiments, bottom plate layer 1606 is an electrically conductive material that is in physical contact with bottom electrode 102 and dielectric layer 104, whereas in other embodiments one or more optional intervening layer(s) can be present (e.g., adhesion layer(s), seed layer(s), conductive layer(s), diffusion barrier layer(s), etc.).

Overlying bottom plate layer 1606 is a switching layer 1608, top electrode layer 1610 and capping layer 1612, as illustrated. Switching layer 1608 and top electrode layer 1610 can comprise materials disclosed throughout this specification or known in the art suitable to serve as these layers for a resistive switching memory or selector device. In various embodiments, capping layer 1612 can be a barrier layer, as described herein. For example, capping layer 1612 can comprise an electrically conductive material such as W metal, TiN, TaN, an aluminum material, a doped silicon material or other suitable electrically conductive material serving as a diffusion barrier material to mitigate or avoid diffusion of metal of top electrode layer 1612 through capping layer 1612, a passivation material to mitigate or avoid contamination of elements (e.g., oxygen, other reactive gases or elements) above capping layer 1612 from reaching top electrode layer 1612, an etch stop material for stopping an etch of layers above capping layer 1612, an adhesion layer for adhering a material deposited above capping layer 1612, or the like or a suitable combination of the foregoing.

FIG. 17 illustrates a resistive device etch 1700 for the deposition stack of FIG. 16. The resistive device etch 1700 can comprise one or more etch processes that form etched capping layer 1712, etched top electrode layer 1710, etched switching layer 1708, and optionally etched bottom plate 1706. In one embodiment, resistive device etch 1706 stops on bottom plate layer 1606 and an optional non-etched bottom plate remains, as illustrated by the dotted lines in FIG. 17. A discrete resistive switching device 1720 results from resistive device etch 1700, as illustrated, though one of ordinary skill in the art would understand that in semiconductor processing many discrete resistive switching devices 1720 on a die or wafer can be produced from an etched deposition stack.

Figure 18:
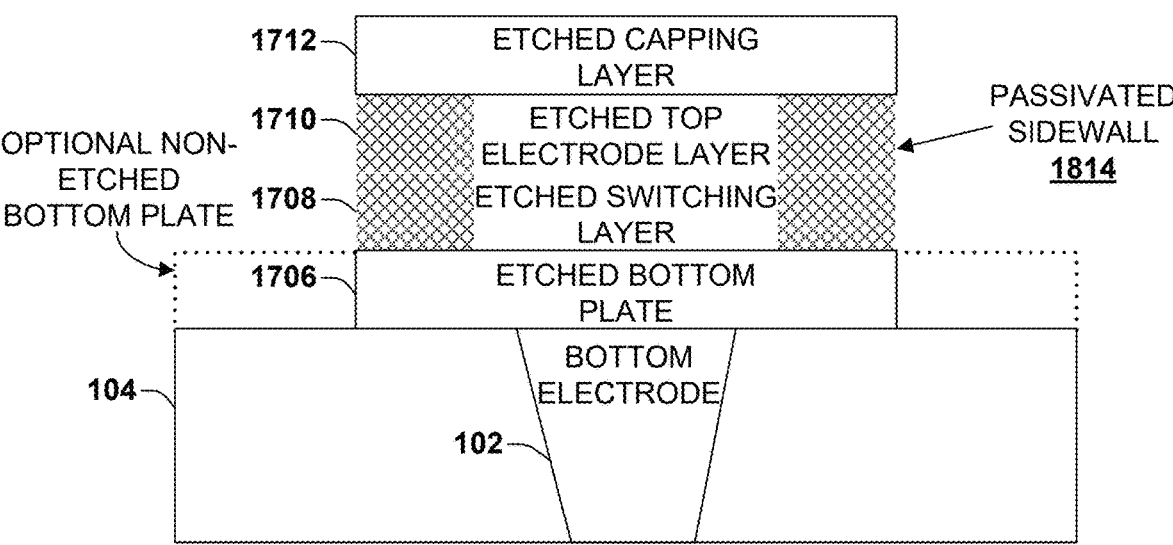
FIG. 18 depicts a block diagram of an example passivated sidewall, and non-passivated core for resistive switching filament formation, in further embodiments.

Referring to FIG. 18, a sidewall passivation process(es) 1800 forms a passivated sidewall 1814 around a perimeter or exterior region of etched top electrode layer 1710 and etched switching layer 1708. In some embodiments, sidewall passivation 1800 can be limited to etched switching layer 1708 or limited to etched top electrode layer 1710 (e.g., see FIGS. 18D, E and F, infra) as an alternative to encompassing both etched top electrode layer 1710 and etched switching layer 1708 as is illustrated by FIG. 18 (and, e.g., FIGS. 18A, B and C, infra).

Sidewall passivation 1800 can create a thickness of material around an exterior portion of etched top electrode layer 1710 or etched switching layer 1708 that mitigates or avoids formation of a conductive filament within passivated sidewall 1814. The thickness of material is measured from an outer surface of discrete resistive switching device 1720 into a depth within discrete resistive switching device 1720. The depth need not be uniform about the device. Nonetheless, because passivated sidewall 1814 is limited to the outer perimeter/exterior portion, the conductive filament can be (effectively) confined to a central or core region of discrete resistive switching device 1720.

Figure 18A:
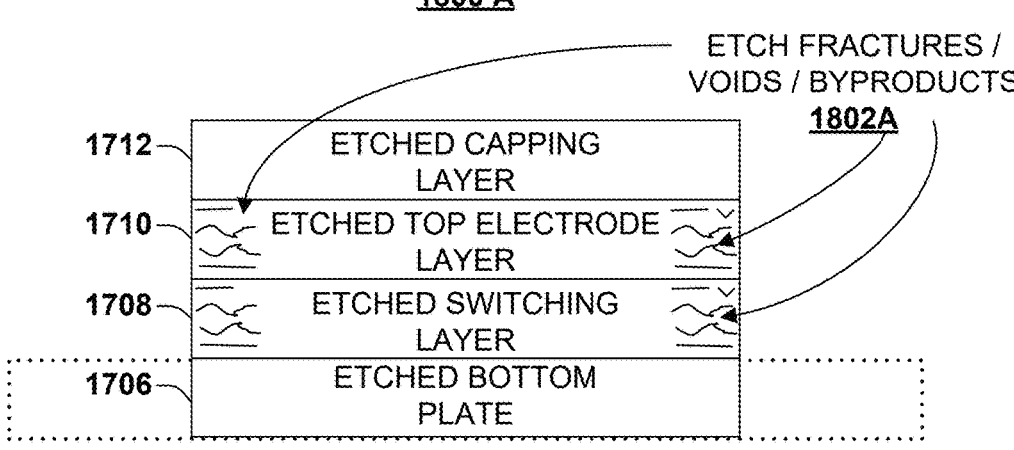
FIGS. 18A, B and C depict block diagrams of an example passivation for a resistive switching device in some embodiments.
Figure 18B:
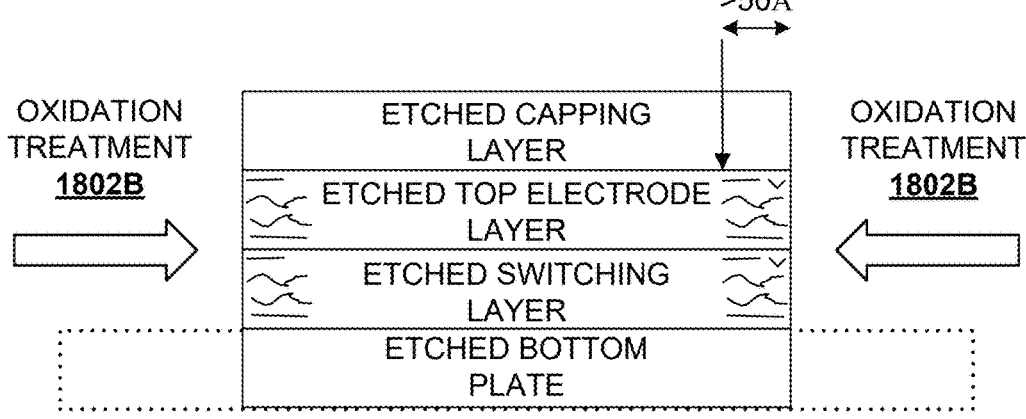
FIGS. 18D, E and F depict block diagrams of a sample passivation for a resistive switching device according to alternative or additional embodiments.
Figure 18C:
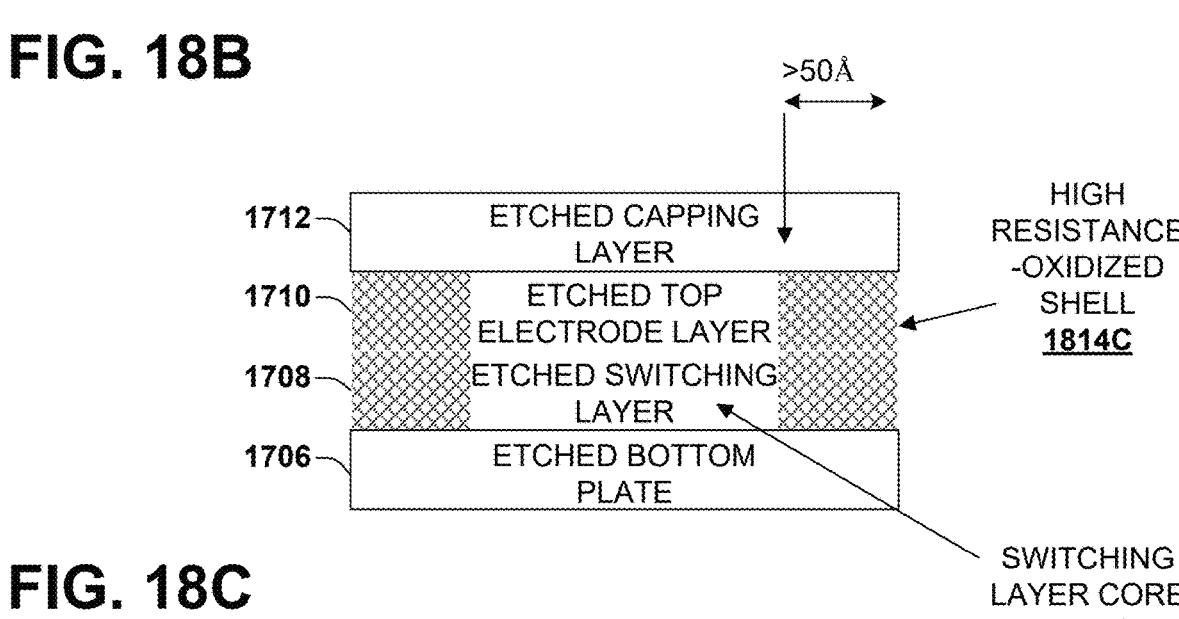

FIGS. 18A, B and C illustrate a first embodiment for sidewall passivation 1800A. FIG. 18A depicts a chemical etch utilized for resistive device etch 1700 suitable to form etch fractures/voids/byproducts 1802A within an exterior portion of etched top electrode layer 1710 and etched switching layer 1708. A depth of the etch fractures/voids/byproducts 1802A can be at least 50 Å in some embodiments, and can be greater in other embodiments. In various embodiments, the chemical etch utilized to produce etch fractures/voids/byproducts 1802A can be a wet chemical etch, or a plasma etch utilizing a liquid/gas such as $Cl_2$, $BCl_3$, HBr or $CHF_3$. In an embodiment, an optional post-etch clean can be utilized to remove some etch byproducts from the etch fractures/voids/byproducts 1802A, which can include a non-reactive or minimally reactive wet clean such as an ultra-dilute HF clean, an EKC clean, a SPM rinse, a $H_2O_2$ rinse, a DI water rinse, or the like, or a suitable combination. FIG. 18B illustrates an oxidation treatment 1802B utilized to oxidize material to the depth greater than 50 Å into the etched top electrode layer 1710 and the etched switching layer 1708 to form a high resistance-oxidized shell 1814C illustrated in FIG. 18C. The high resistance-oxidized shell 1814C will have a relatively low electric field in response to a voltage applied to discrete resistive switching device 1720, as compared with a switching layer core 1812C. This localizes filament formation within switching layer core 1812C, and mitigates or avoids formation of a conductive filament within high resistance-oxidized shell 1814C.

In various embodiments, etched top electrode layer 1710 can be an aluminum-nitrogen material, such as a non-stoichiometric aluminum-rich nitrogen or a non-stoichiometric aluminum-rich oxygen. Alternatively or in addition, etched switching layer 1708 can be a non-stoichiometric aluminum-rich nitrogen or a non-stoichiometric aluminum-rich oxygen, in some embodiments. Because aluminum tends to oxidize in a self-limiting manner called anodization, it is difficult to significantly oxidize aluminum up to 50 Å depth within an aluminum-containing material. Accordingly, the chemical/plasma etch utilized to form etch fractures/voids/byproducts 1802A is selected to achieve a greater than 50 Å depth of voids and fractures in the aluminum-containing material to allow oxidation treatment 1802B to reach a depth greater than 50 Å into the material. In various embodiments, oxidation treatment 1802B can be a high temperature oxygen gas (e.g., 140 to 270 degrees Celsius, or up to 350 degrees Celsius or any suitable value or range between 140 and 350 degrees Celsius), or an oxygen plasma or $O_2$ ash.

By achieving greater than 50 Å oxygen penetration to these materials, a high resistance-oxidized shell 1814C of greater than 50 Å thickness can be achieved. This in turn allows the switching layer core 1812C to be confined to a diameter less than 100 Å smaller than a width of etched switching layer 1708 and etched top electrode layer 1710. This is despite the physical self-limiting anodization properties of aluminum metal. Accordingly, the first embodiment for sidewall passivation 1800A is believed to be able to achieve a passivation effect not known for conventional aluminum containing materials.

Figure 18D:
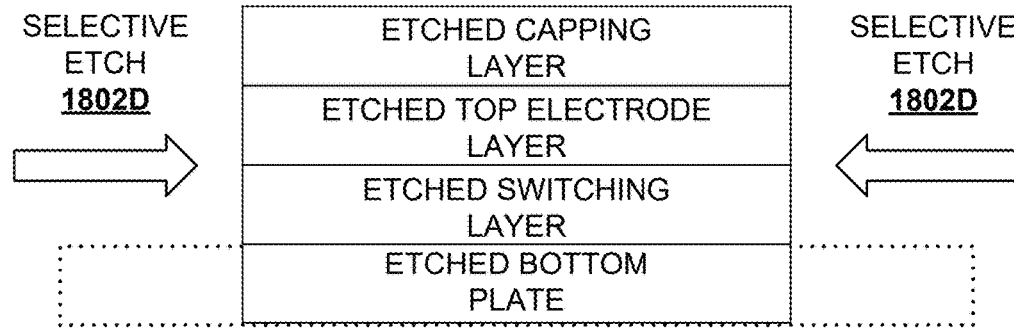
Figure 18E:
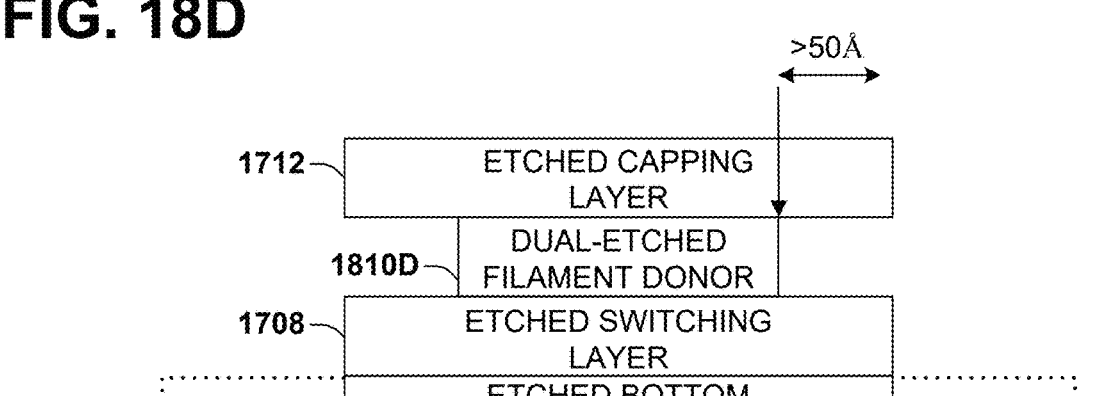
Figure 18F:
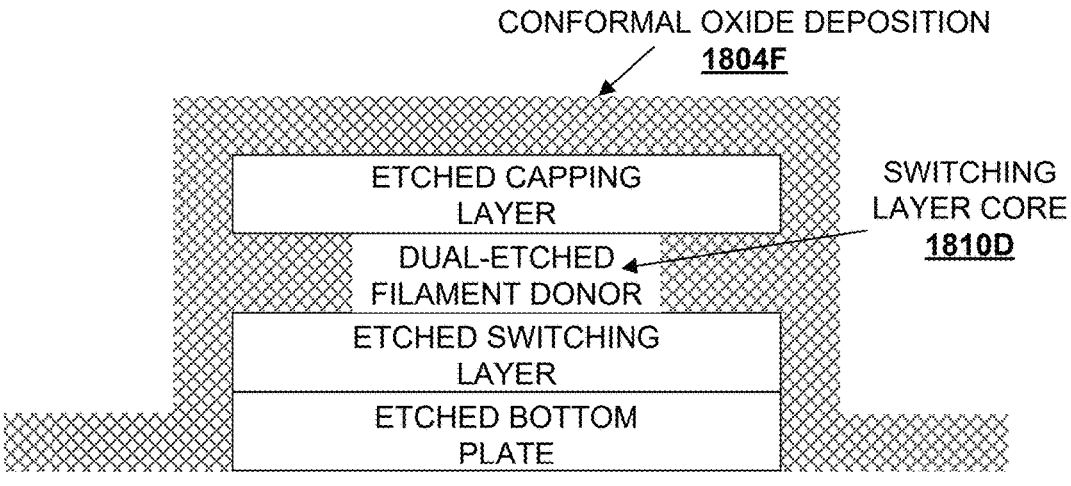

FIGS. 18D, E and F depict a second embodiment for sidewall passivation 1800B according to further embodiments of the present disclosure. Following a resistive device etch 1700 illustrated by FIG. 17, a highly selective etch 1802D can be performed on the discrete resistive switching device 1720. The highly selective etch 1802D can be selective to a material of etched top electrode layer 1710, removing an exterior portion of etched top electrode layer 1710 up to a depth greater than 50 Å. The highly selective etch 1802D then forms a dual-etched filament donor 1810D defining a central core of discrete resistive switching device 1720. Subsequently, a highly electrically resistive conformal oxide deposition 1804F is implemented to conformally fill the exterior portion of etched top electrode layer 1710 removed by highly selective etch 1802D. In an embodiment, the conformal oxide deposition 1804F can be an atomic layer deposition (ALD) oxide deposition. Additionally, the oxide deposition 1804F overlies peripheral surfaces of discrete resistive switching device 1720, the top surface of etched capping layer 1712 and the top surface of dielectric layer 104 (or bottom plate 1606). Conformal oxide deposition 1804F is highly electrically resistive, minimizing current and electric field therein, thereby mitigating or avoiding formation of a conductive filament within conformal oxide deposition 1804F. This effectively confines the filament to a switching layer core 1810D as a result of second embodiment for sidewall passivation 1800B.

In an embodiment, highly selective etch 1802D can comprise a very dilute ammonium hydroxide, or very dilute TMAH. The dilution ratio can be greater than about 8000 parts ammonium hydroxide or TMAH to solvent (e.g., water), in an embodiment. In another embodiment, the dilution ratio can be in a range from about 10000:1 ammonium hydroxide or TMAH to solvent to about 14000:1 ammonium hydroxide or TMAH to solvent. In further embodiments, etched top electrode layer 1710 can be a non-stoichiometric aluminum-rich nitrogen material (e.g., formed with a PVD process). In another embodiment, etched switching layer 1708 can be a stoichiometric or non-stoichiometric aluminum oxide material (e.g., formed with a PVD process) that is resistant to the very dilute ammonium hydroxide or TMAH highly selective etch 1802D. In further embodiments, etched capping layer 1712 or etched bottom plate 1706 can be a Ti or W metal or other electrically conductive material suitably resistant to the highly selective etch 1802D.

The diagrams included herein are described with respect to several components, layers and materials of a resistive switching device or a die or wafer comprising many resistive switching devices. It should be appreciated that such diagrams can include those components, layers and materials specified therein, some of the specified components/layers/materials, or additional components/layers/materials not explicitly depicted but known in the art or reasonably conveyed to those of skill in the art by way of the context provided herein. Sub-layers can also be implemented as adjacent other sub-layers within a depicted layer. Additionally, it is noted that one or more disclosed processes can be combined into a single process providing aggregate functionality. For instance, a deposition process can comprise an etching process, or vice versa, to facilitate depositing and etching a component of an integrated circuit device by way of a single process. Components of the disclosed architectures can also interact with one or more other components not specifically described herein but known by those of skill in the art.

Figure 19:
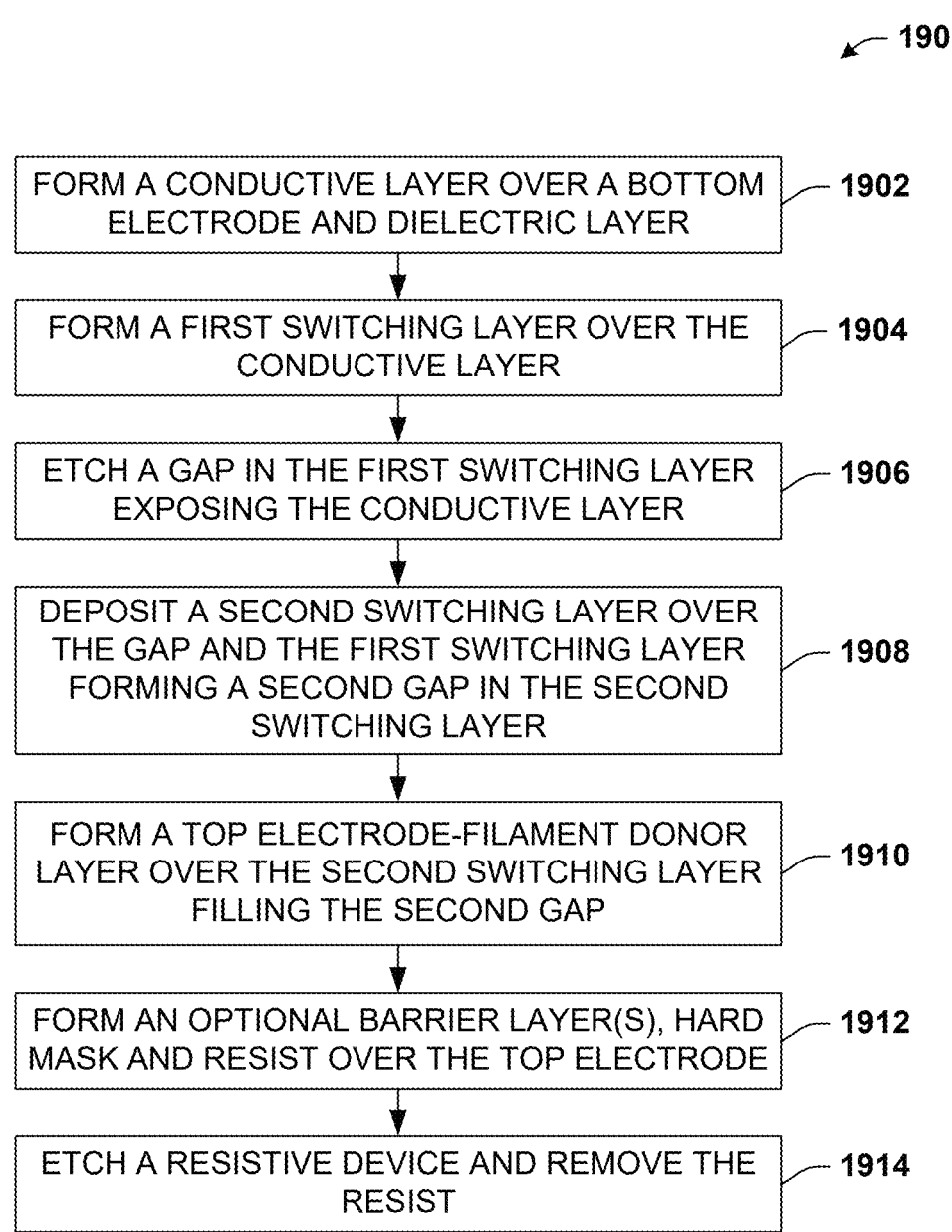
FIG. 19 illustrates a flowchart of an example method for fabricating a resistive switching device, in various embodiments.
Figure 21:
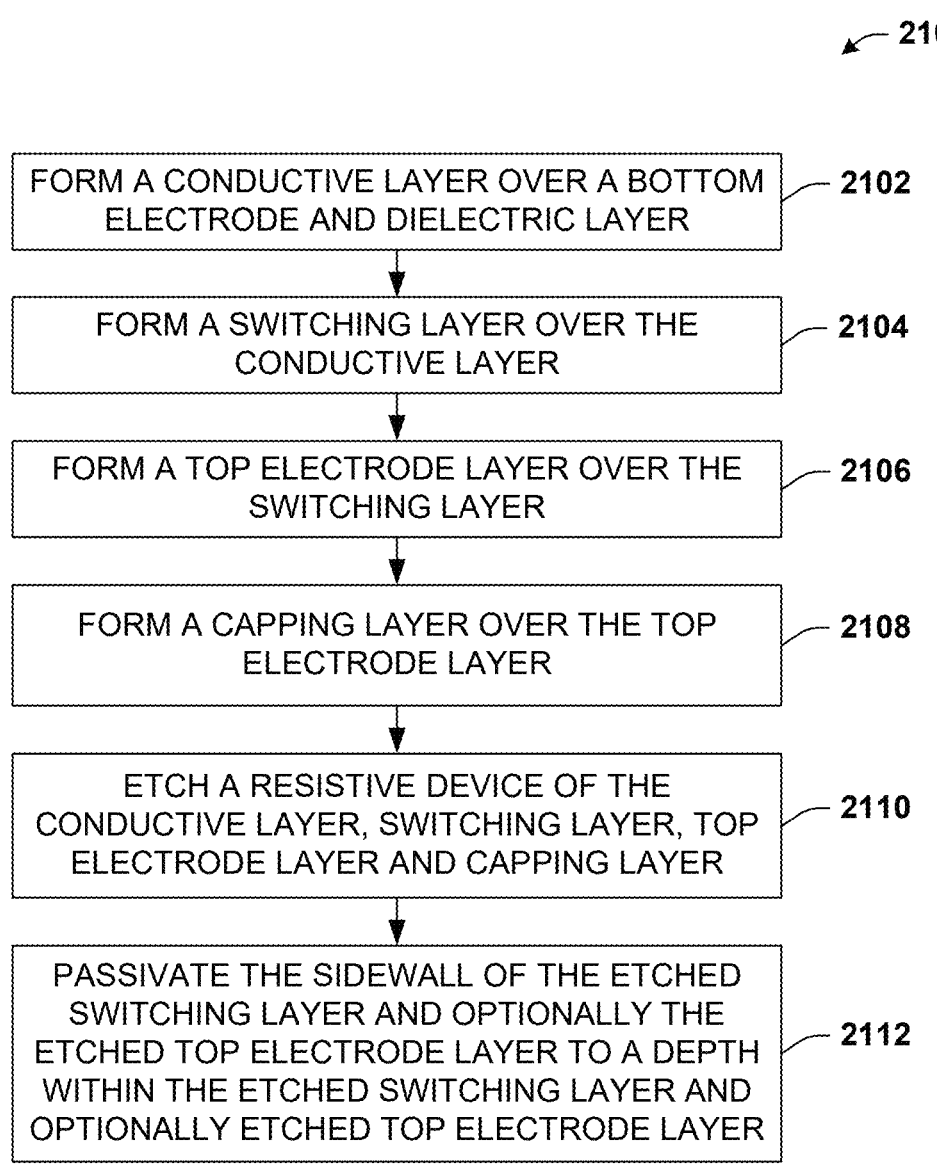
FIG. 21 depicts a flowchart of an example method for fabricating a resistive switching device according to still further embodiments.

In view of the exemplary diagrams described supra, process methods that can be implemented in accordance with the disclosed subject matter will be better appreciated with reference to the flow charts of FIGS. 19-21. While for purposes of simplicity of explanation, the methods of FIGS. 19-21 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein are also considered within the scope of the present disclosure. Moreover, some steps illustrated as part of one process can be implemented for another process where suitable (e.g., optional barrier/additional layer(s), dielectric hard mask and patterned resist illustrated in FIG. 14 can be implemented for other processes disclosed in the present specification (e.g., overlying the deposition of FIG. 16); other steps of one or more processes can be added or substituted in other processes disclosed herein within the scope of the present disclosure). Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring to FIG. 19, a flowchart is depicted of an example method 1900 for fabricating a resistive memory device according to one or more embodiments of the present disclosure. At 1902, method 1900 can comprise forming a conductive layer over a bottom electrode and a dielectric layer. The conductive layer can be a metal layer in an embodiment (e.g., W metal), a conductive metal compound (e.g., metal nitride such as TIN, TaN or the like) or other suitable electrically conductive material. In some embodiments, the conductive layer is in physical contact with the bottom electrode or dielectric layer; whereas in other embodiments one or more intervening layers can be positioned there between (e.g., adhesion layer(s), seed layer(s), passivation layer(s), diffusion barrier layer(s), ion conduction layer(s), or the like or a suitable combination).

At 1904, method 1900 can comprise forming a first switching layer overlying the conductive layer. The first switching layer can be in physical contact with the conductive layer in one or more embodiments. The first switching layer can be formed to have a thickness in a range of about 15 Å and about 50 Å. Furthermore, the first switching layer can be formed of an electrically resistive material. In various embodiments, the first switching layer can comprise an electrically resistive metal-nitrogen material or an electrically resistive metal-oxygen material. In an embodiment, the first switching layer can be formed as a relatively molecularly dense layer (compared to the second switching layer; see infra) that resists permeability within the first switching layer of conductive particles of the resistive memory device. In at least one embodiment, the first switching layer can be a stoichiometric metal-oxide material (e.g., $AlO_x$, among others) formed with an ALD process.

At 1906, method 1900 can comprise etching a gap in the first switching layer forming an etched first switching layer. Etching the gap can comprise removing a thickness of the first switching layer. In an embodiment, etching the gap can comprise removing an entire thickness of the first switching layer in a portion of the first switching layer, exposing a top surface of the conductive layer to the gap. In another embodiment, etching the gap can comprise retaining a thin layer (e.g., a few angstroms to a couple nanometers) of first switching layer overlying the top surface of the conductive layer in the gap. In yet another embodiment, etching the gap can comprise retaining only very thin islands of the first switching layer (e.g., a few angstroms thick) such that portions of the top surface of the conductive layer are exposed to the gap that are not covered by the very thin islands of the first switching layer. Examples of a material utilized for the first switching layer include $SiO_x$, amorphous Si, Si, $TiO_x$, $AlO_x$, $HfO_x$, $NiO_x$, $TaO_x$, $NbO_x$, $ZnO_2$, $ZrO_x$, $GdO_x$, a metal-nitrogen (e.g., $AlN_x$) or the like, or a suitable combination of the foregoing.

At 1908, method 1900 can comprise depositing a second switching layer over the gap and the first switching layer forming a second gap in the second switching layer. The second switching layer can have a second thickness in a range of about 15 Å and about 50 Å. In one or more embodiments the second switching layer can comprise a metal-oxygen material or a metal-nitrogen material. In an embodiment(s), the second switching layer can comprise the same material as the first switching layer, whereas in other embodiments the second switching layer can be a different material from the first switching layer (e.g., a different material from the list provided above for first switching material, or an entirely different material in at least one embodiment). In at least one embodiment, the second switching layer can be formed of the same material as the first switching layer, but utilizing a different deposition process resulting in a different relative atomic concentration of the same material. As one example, the second switching layer can be a non-stoichiometric $AlO_y$ material produced with a PVD process, where y is a suitable non-stoichiometric relative concentration of oxygen atoms to aluminum atoms, and the first switching layer can be a stoichiometric $AlO_x$ material produced with a ALD process, where x is a suitable stoichiometric relative concentration of oxygen atoms to aluminum atoms. In one or more embodiments, first switching layer or second switching layer can further be doped with from about 0.5% to about 1.0% Si atoms by atomic percentage, or any suitable value or range there between. In an embodiment, the second switching layer is in direct physical contact with a top surface of the conductive layer exposed to the gap, although in other embodiments a thin layer (or non-contiguous islands thereof) of first switching layer can remain between the second switching layer and the top surface of the conductive layer.

At 1910, method 1900 can comprise forming a top electrode—filament donor layer over the second switching layer and filling the second gap. The top electrode—filament donor layer can comprise conductive particles that are at least in part permeable within the second switching layer. In an embodiment, the conductive particles can be less permeable within the first switching layer (e.g., due to an increased density of stoichiometric material utilized for the first switching layer). In one or more embodiments, top electrode—filament donor layer can be selected from a material including (in one embodiment) or exclusive to (in another embodiment): Al, a non-stoichiometric $AlN_x$, a stoichiometric or non-stoichiometric $AlNO_x$, TIN, Ti, W or the like, or a suitable combination of the foregoing.

At 1912, method 1900 can comprise forming an optional barrier layer(s) and forming a hard mask layer and patterned photoresist over the top electrode—filament donor layer. The optional barrier layer can be a TiN, TaN, W or Ti material. The hard mask layer can be comprised of $SiO_2$, SiN, SiC, $SiO_N$, amorphous carbon or the like, or a suitable combination of the foregoing. At 1914, method 1900 can comprise etching a discrete resistive switching device and removing the patterned photoresist. The discrete resistive switching device resulting from the etching can comprise an etched hard mask, optionally an etched optional barrier(s), an etched top electrode—filament donor, an etched second switching layer, and a further-etched first switching layer. In an embodiment, the conductive layer can also be etched as part of the discrete resistive switching device forming an etched conductive layer, though in other embodiments etching the discrete resistive switching device can stop on the conductive layer.

In some embodiments, etching the discrete resistive switching device can comprise a two-etch process that etches the hard mask layer and forms the etched hard mask with a first etch process. The first etch process can stop on the optional barrier layer(s) (if present) or can stop on the top electrode—filament donor layer depending on embodiment(s). A second etch process of the two-etch process can form the etched top electrode—filament donor, the etched second switching layer and the further-etched first switching layer. In an embodiment, the second etch process can also form the etched conductive layer. The second etch process that forms the etched top electrode—filament donor, the etched second switching layer and the further-etched first switching layer can comprise a $BCl_3$ or HBr wet etch chemical in at least one embodiment.

In alternative embodiments, etching the discrete resistive switching device can comprise a three-step process. A first etch process of the three-step process can etch the hard mask layer (and all of the optional barrier layer—if present—or a portion of the optional barrier layer). A second etch process can etch any remaining portion of the optional barrier layer (if present), and also the top electrode—filament donor, the second switching layer and the etched first switching layer. A third etch of the three-etch process can then etch the conductive layer to form the etched conductive layer.

FIG. 20 illustrates a flowchart of an example method 2000 for forming a resistive switching device according to alternative or additional embodiments of the present disclosure. At 2002, method 2000 can comprise forming a conductive layer overlying a bottom electrode and dielectric layer of a semiconductor device. In an embodiment, the conductive layer can be a conductive metal layer (e.g., W metal, Ti metal, or other suitable conductive metal). In various embodiments, the bottom electrode and dielectric layer overlie a substrate of the semiconductor device, and in at least one embodiment the dielectric layer can be formed on a top surface of the substrate. In some embodiments, the conductive layer is in physical contact with the bottom electrode and with the dielectric layer; whereas in other embodiments one or more intervening layers are provided there between. Example intervening layers can include an adhesion layer(s), a seed layer(s), a conductive layer(s), an ion conductor layer(s), a diffusion barrier layer(s), a passivation layer(s), or the like or a suitable combination of the foregoing.

At 2004, method 2000 can comprise forming a switching layer overlying the conductive layer. The switching layer can have a first thickness, in various embodiments, and can comprise a resistive switching material that is at least in part permeable to conductive particles. In further embodiments, the switching layer can be in physical contact with the conductive layer, though in some embodiments there can be one or more intervening layers. At 2006, method 2000 can comprise forming a barrier layer overlying the switching layer. In one or more embodiments, the barrier layer can comprise a material that resists permeability of the conductive particles within the barrier layer.

At 2008, method 2000 can comprise etching a gap in the barrier layer exposing a portion of the switching layer to the gap. At 2010, method 2000 can comprise treating or control etching the portion of the switching layer exposed to the gap. In an embodiment(s), treating or control etching can comprise etching with a second etch the portion of the switching layer exposed to the gap in the barrier layer, and causing the portion of the switching layer to have a second thickness smaller than the first thickness of the switching layer.

At 2012, method 2000 can comprise forming a top electrode overlying the barrier layer and the treated switching layer. In an embodiment, the top electrode can be in physical contact with both the barrier layer and with the portion of the resistive switching layer. Moreover, the top electrode can be selected from a material that contains the conductive particles, and that provides the conductive particles to the portion of the resistive switching layer in response to an electrical stimulus. At 2014, method 2000 can comprise etching with a third etch a discrete resistive switching device comprising the top electrode, the barrier layer and the switching layer.

In at least one embodiment, the third etch an further comprise etching the conductive metal layer in forming the discrete resistive switching device. In another embodiment, method 2000 can further comprise forming a hard mask layer overlying the top electrode. In such embodiment, etching with the third etch can further comprise etching the hard mask layer in forming the discrete resistive switching device.

In a further embodiment, method 2000 can comprise performing a cleaning process following the second etch. The cleaning process can be directed to the portion of the switching layer that is etched with the second etch. For instance, the second etch and the cleaning process can at least in part utilize the barrier material for a mask. In various embodiments, the cleaning process can comprise an oxygen plasma or an argon sputtering, and can further comprise removing etchant byproducts produced by the second etch from a top surface of the portion of the switching layer.

In reference to FIG. 21, there is depicted a method 2100 for fabricating a resistive switching device according to still further embodiments of the present disclosure. At 2102, method 2100 can comprise forming a conductive layer over a bottom electrode situated within a dielectric layer of a semiconductor substrate. At 2104, method 2100 can comprise forming a switching layer overlying and in physical contact with the conductive layer. In an embodiment(s), the switching layer can comprise an electrically resistive material at least in part permeable to conductive particles. Additionally, at 2106, method 2100 can comprise forming a top electrode layer overlying and in physical contact with the switching layer. The top electrode can comprise a material that provides the conductive particles that drift into the switching layer in response to an electrical stimulus applied across the bottom electrode and the top electrode.

At 2108, method 2100 can comprise forming a capping layer overlying the top electrode layer. At 2110, method 2100 can comprise etching the capping layer, the top electrode layer and the switching layer to form a discrete resistive switching device. In one or more embodiments, the etching can comprise a wet etch portion that chemically etches at least the switching layer resulting in an etched switching layer. At 2112, method 2100 can comprise passivating a perimeter of the etched switching layer or of the etched top electrode layer up to a depth within the resistive switching device and forming a passivated shell surrounding a core of the resistive switching device. The passivated shell can have an electrical resistance higher than the electrically resistive material of the switching layer in an embodiment. In another embodiment, the passivated shell can have a lower permeability to the conductive particles of the top electrode layer than the electrically resistive material of the switching layer. In still another embodiment, the passivated shell can have a higher electrical resistance and a lower permeability to the conductive particles than the electrically resistive material of the switching layer.

In at least one embodiment, passivating the perimeter of the etched switching layer can further comprise-following the wet etch portion that chemically etches at least the switching layer-oxidizing the perimeter of the etched switching layer to a depth greater than 50 Å inward toward the core of the resistive switching device from the perimeter to form the passivated shell. In one or more embodiments, oxidizing the perimeter can form a material for the passivated shell having higher oxygen by atomic weight than the electrically resistive material. In further embodiments, the electrically resistive material of the switching layer is an aluminum oxide material and the wet etch portion that chemically etches at least the switching layer forms porous voids within the aluminum oxide material from the perimeter inward toward the core of the etched switching layer. In additional embodiments, oxidizing the perimeter can further comprise utilizing an O₂ ash, an oxygen plasma or a high temperature oxygen flow to promote the oxidizing the perimeter of the aluminum oxide material of the switching layer to the depth greater than 50 Å. In an embodiment, the 02 ash, the oxygen plasma or the high temperature oxygen flow can be implemented with a temperature from about 140 degrees Celsius, to about 350 degrees Celsius, or any suitable value or range there between. In one or more embodiments, the oxidizing further produces an oxygen rich aluminum oxide for the passivated shell having the higher oxygen by atomic weight than the electrically resistive material.

In alternative or additional embodiments, method 2000 can comprise passivating the perimeter of the etched switching layer can further comprise-following the wet etch portion that chemically etches at least the switching layer—by selectively etching the top electrode layer with an etchant that etches the top electrode layer much more rapidly than the switching layer up to the depth within the resistive switching device to selectively remove the top electrode layer up to the depth within the resistive switching device. Furthermore, method 2000 can comprise depositing a stoichiometric ALD oxide dielectric material conformally over exposed surfaces of the resistive switching device exposed by the etching to form the discrete resistive switching device, and exposed by the selectively etching the top electrode layer up to the depth within the resistive switching device. In an embodiment(s), the passivated shell is formed of the ALD oxide dielectric material surrounding a core of the top electrode layer comprising a material of the top electrode layer. In various additional embodiments, the material of the top electrode layer can be a non-stoichiometric aluminum-nitrogen material AlNx formed by a PVD process, the switching layer can be a non-stoichiometric aluminum-oxygen material AlOy formed by PVD process, or the etchant that selectively etches the top electrode layer is a diluted ammonium hydroxide or a diluted TMAH. In at least one embodiment, the diluted TMAH or diluted ammonium hydroxide can be diluted to a range of about 8,000 parts dilutant to 1 part TMAH or ammonium hydroxide to about 14,000 parts dilutant to 1 part TMAH or ammonium hydroxide, or any suitable value or range there between.

Example Operating Environments

Figure 22:
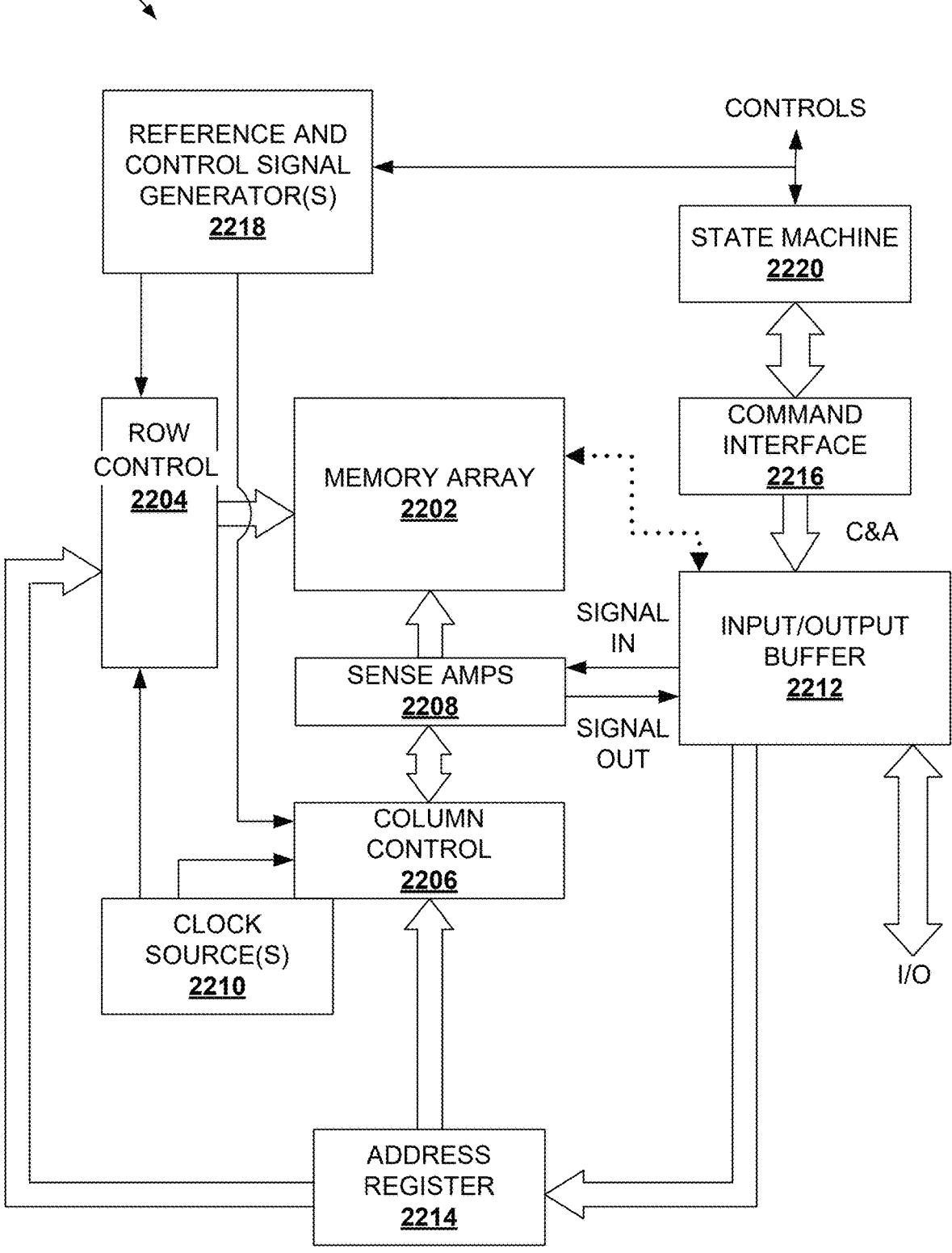
FIG. 22 illustrates a block diagram of an example electronic operating environment in accordance with embodiments of the present disclosure.

FIG. 22 illustrates a block diagram of an example operating and control environment 2200 for a memory array 2202 of a memory cell array according to aspects of the subject disclosure. Control environment 2200 and memory array 2202 can be formed within a single semiconductor die in some embodiments, although the subject disclosure is not so limited and in other embodiments some components of control environment 2200 can be formed on a separate semiconductor die. In at least one aspect of the subject disclosure, memory array 2202 can comprise memory selected from a variety of memory cell technologies. In at least one embodiment, memory array 2202 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a resistive memory technology formed by a process disclosed herein.

A column controller 2206 and sense amps 2208 can be formed adjacent to memory array 2202. Moreover, column controller 2206 can be configured to activate (or identify for activation) a subset of bit lines of memory array 2202. Column controller 2206 can utilize a control signal provided by a reference and control signal generator(s) 2218 to activate, as well as operate upon, respective ones of the subset of bitlines, applying suitable program, erase or read voltages to those bitlines. Non-activated bitlines can be kept at an inhibit voltage (also applied by reference and control signal generator(s) 2218), to mitigate or avoid bit-disturb effects on these non-activated bitlines.

In addition, operating and control environment 2200 can comprise a row controller 2204. Row controller 2204 can be formed adjacent to and electrically connected with word lines of memory array 2202. Also utilizing control signals of reference and control signal generator(s) 2218, row controller 2204 can select particular rows of memory cells with a suitable selection voltage. Moreover, row controller 2204 can facilitate program, erase or read operations by applying suitable voltages at selected word lines.

Sense amps 2208 can read data from, or write data to, the activated memory cells of memory array 2202, which are selected by column control 2206 and row control 2204. Data read out from memory array 2202 can be provided to an input/output buffer 2212. Likewise, data to be written to memory array 2202 can be received from the input/output buffer 2212 and written to the activated memory cells of memory array 2202.

A clock source(s) 2210 can provide respective clock pulses to facilitate timing for read, write, and program operations of row controller 2204 and column controller 2206. Clock source(s) 2210 can further facilitate selection of word lines or bit lines in response to external or internal commands received by operating and control environment 2200. Input/output buffer 2212 can comprise a command and address input, as well as a bidirectional data input and output. Instructions are provided over the command and address input, and the data to be written to memory array 2202 as well as data read from memory array 2202 is conveyed on the bidirectional data input and output, facilitating connection to an external host apparatus, such as a computer or other processing device (not depicted, but see e.g., computer 2302 of FIG. 23, infra).

Input/output buffer 2212 can be configured to receive write data, receive an erase instruction, receive a status or maintenance instruction, output readout data, output status information, and receive address data and command data, as well as address data for respective instructions. Address data can be transferred to row controller 2204 and column controller 2206 by an address register 2214. In addition, input data is transmitted to memory array 2202 via signal input lines between sense amps 2208 and input/output buffer 2212, and output data is received from memory array 2202 via signal output lines from sense amps 2208 to input/output buffer 2212. Input data can be received from the host apparatus, and output data can be delivered to the host apparatus via the I/O bus.

Commands received from the host apparatus can be provided to a command interface 2216. Command interface 2216 can be configured to receive external control signals from the host apparatus, and determine whether data input to the input/output buffer 2212 is write data, a command, or an address. Input commands can be transferred to a state machine 2220.

State machine 2220 can be configured to manage programming and reprogramming of memory array 2202 (as well as other memory banks of a multi-bank memory array). Instructions provided to state machine 2220 are implemented according to control logic configurations, enabling state machine 2220 to manage read, write, erase, data input, data output, and other functionality associated with memory cell array 2202. In some aspects, state machine 2220 can send and receive acknowledgments and negative acknowledgments regarding successful receipt or execution of various commands. In further embodiments, state machine 2220 can decode and implement status-related commands, decode and implement configuration commands, and so on.

To implement read, write, erase, input, output, etc., functionality, state machine 2220 can control clock source(s) 2210 or reference and control signal generator(s) 2218. Control of clock source(s) 2210 can cause output pulses configured to facilitate row controller 2204 and column controller 2206 implementing the particular functionality. Output pulses can be transferred to selected bit lines by column controller 2206, for instance, or word lines by row controller 2204, for instance.

Figure 23:
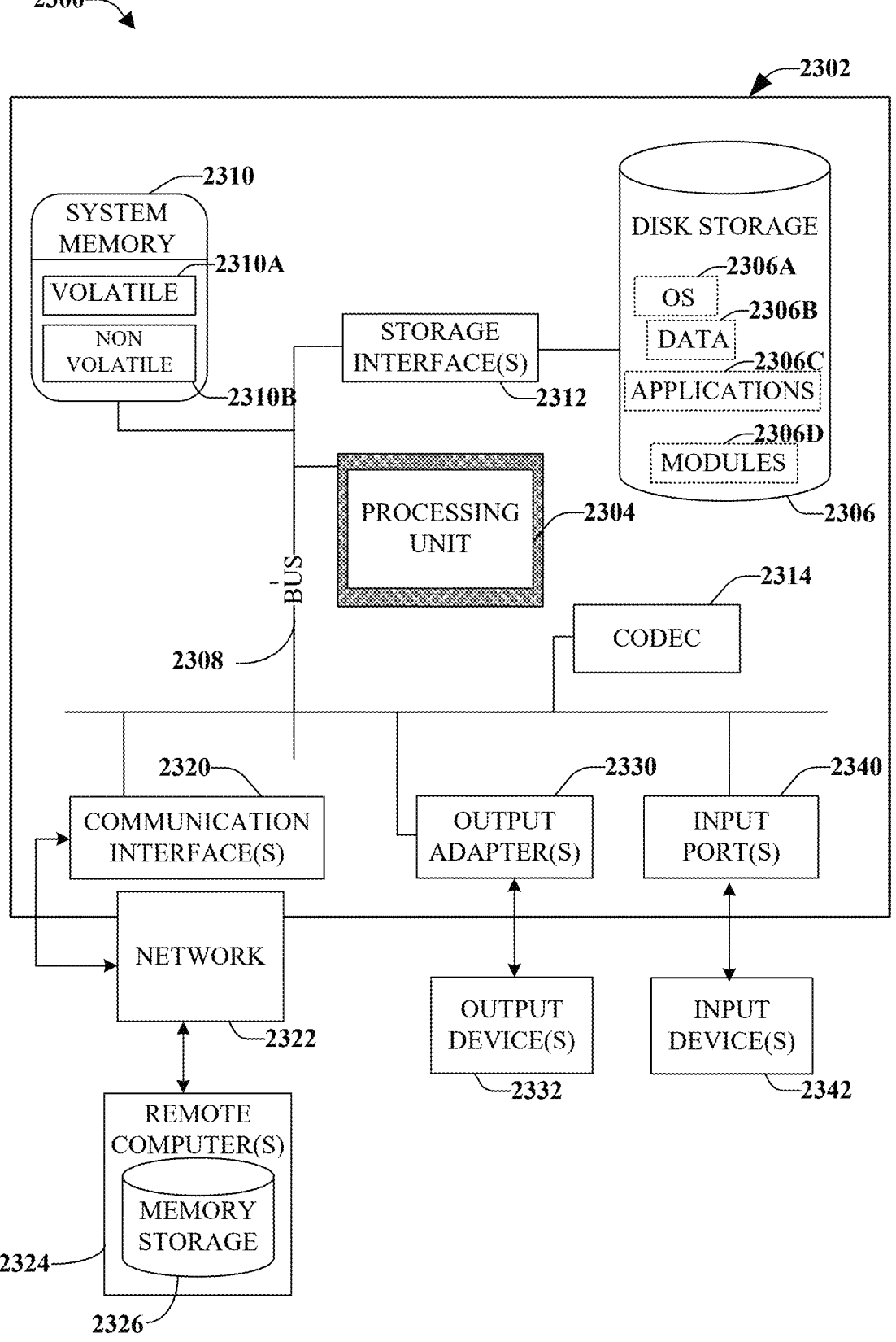
FIG. 23 depicts a block diagram of an example computing environment for implementing one or more disclosed embodiments presented herein.

In connection with FIG. 23, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 23, a suitable environment 2300 for implementing various aspects of the claimed subject matter includes a computer 2302. The computer 2302 includes a processing unit 2304, a system memory 2310, a codec 2314, and a system bus 2308. The system bus 2308 couples system components including, but not limited to, the system memory 2310 to the processing unit 2304. The processing unit 2304 can be any of various available processors. Dual microprocessors and other multiprocessor architectures also can be employed as the processing unit 2304.

The system bus 2308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 2310 includes volatile memory 2310A and non-volatile memory 2310B. The basic input/output system (BIOS), containing the basic routines to transfer information between elements within the computer 2302, such as during start-up, is stored in non-volatile memory 2310B. In addition, according to present innovations, codec 2314 may include at least one of an encoder or decoder, wherein the at least one of an encoder or decoder may consist of hardware, software, or a combination of hardware and software. Although, codec 2314 is depicted as a separate component, codec 2314 may be contained within non-volatile memory 2310B. By way of illustration, and not limitation, non-volatile memory 2310B can include read only memory (ROM), programmable ROM (PROM), electrically programmable ROM (EPROM), electrically erasable programmable ROM (EEPROM), or flash memory, two-terminal memory, and so on. Volatile memory 2310A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ES-DRAM).

Computer 2302 may also include removable/non-removable, volatile/non-volatile computer storage medium. FIG. 23 illustrates, for example, disk storage 2306. Disk storage 1306 includes, but is not limited to, devices like a magnetic disk drive, solid state disk (SSD) floppy disk drive, tape drive, Jaz drive, Zip drive, LS-100 drive, flash memory card, or memory stick. In addition, disk storage 2306 can include storage medium separately or in combination with other storage medium including, but not limited to, an optical disk drive such as a compact disk ROM device (CD-ROM), CD recordable drive (CD-R Drive), CD rewritable drive (CD- RW Drive) or a digital versatile disk ROM drive (DVD-ROM). To facilitate connection of the disk storage devices 2306 to the system bus 2308, a removable or non-removable interface is typically used, such as storage interface 2312. It is appreciated that storage devices 2306 can store information related to a user. Such information might be stored at or provided to a server or to an application running on a user device. In one embodiment, the user can be notified (e.g., by way of output device(s) 2332) of the types of information that are stored to disk storage 2306 or transmitted to the server or application. The user can be provided the opportunity to opt-in or opt-out of having such information collected and/or shared with the server or application (e.g., by way of input from input device(s) 2342).

It is to be appreciated that FIG. 23 describes software that acts as an intermediary between users and the basic computer resources described in the suitable operating environment 2300. Such software includes an operating system 2306A. Operating system 2306A, which can be stored on disk storage 2306, acts to control and allocate resources of the computer system 2302. Applications 2306C take advantage of the management of resources by operating system 2306A through program modules 2306D, and program data 2306D, such as the boot/shutdown transaction table and the like, stored either in system memory 2310 or on disk storage 2306. It is to be appreciated that the claimed subject matter can be implemented with various operating systems or combinations of operating systems.

A user enters commands or information into the computer 2302 through input device(s) 2342. Input devices 2342 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2304 through the system bus 2308 via input port(s) 2340. Input port(s) 2340 include, for example, a serial port, a parallel port, a game port, and a universal serial bus (USB). Output device(s) 2332 use some of the same type of ports as input device(s) 2342. Thus, for example, a USB port may be used to provide input to computer 2302 and to output information from computer 2302 to an output device 2332. Output adapter 2330 is provided to illustrate that there are some output devices 2332 like monitors, speakers, and printers, among other output devices 2332, which require special adapters. The output adapters 2330 include, by way of illustration and not limitation, video and sound cards that provide a means of connection between the output device 2332 and the system bus 2308. It should be noted that other devices and/or systems of devices provide both input and output capabilities such as remote computer(s) 2338.

Computer 2302 can operate in a networked environment using logical connections to one or more remote computers, such as remote computer(s) 2324. The remote computer(s) 2324 can be a personal computer, a server, a router, a network PC, a workstation, a microprocessor based appliance, a peer device, a smart phone, a tablet, or other network node, and typically includes many of the elements described relative to computer 2302. For purposes of brevity, only a memory storage device 2326 is illustrated with remote computer(s) 2324. Remote computer(s) 2324 is logically connected to computer 2302 through a network 2322 and then connected via communication interface(s) 2320. Network 2322 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 2320 refers to the hardware/software employed to connect the network 2322 to the bus 2308. While communication interface(s) 2320 is shown for illustrative clarity inside computer 2302, it can also be external to computer 2302. The hardware/software necessary for connection to the network 2322 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A resistive switching memory cell, comprising:
a bottom electrode formed within a dielectric material overlying a substrate;
a conductive layer overlying and in contact with both the bottom electrode and the dielectric layer;
a first resistive switching layer formed of an electrically resistive material overlying the conductive layer;
a second resistive switching layer formed overlying the first resistive switching layer, wherein the first resistive switching layer further comprises a gap formed therein that exposes a surface of the conductive layer directly to a portion of the second resistive switching layer within the gap in the first resistive switching layer; and
a top electrode overlying the second resistive switching layer and comprising conductive particles that diffuse within the second resistive switching layer in response to a suitable electrical stimulus applied to the resistive switching memory cell.

2. The resistive switching memory cell of claim 1, wherein the second resistive switching layer is formed conformally overlying the first resistive switching layer and the gap in the first resistive switching layer, and the second resistive switching layer comprises a second gap formed in the second resistive switching layer and overlying the gap in the first resistive switching layer.

3. The resistive switching memory cell of claim 2, wherein the top electrode fills the second gap formed in the second resistive switching layer to form a portion of the top electrode that is closer to the bottom plate, in a region of the resistive switching memory cell defined by the second gap, than a second portion of the top electrode outside of the second gap.

4. The resistive switching memory cell of claim 1, wherein the second resistive switching layer is formed of a non-stoichiometric metal oxygen or metal nitrogen material.

5. The resistive switching memory ell of claim 4, wherein the top electrode is formed of a noble metal, a diffusive metal alloy, mixture or compound, a non-stoichiometric metal and nitrogen material, or a non-stoichiometric metal and oxygen material.

6. The resistive switching memory cell of claim 4, wherein the first resistive switching layer is formed of a stoichiometric or substantially stoichiometric metal oxygen or metal nitrogen material.

7. The resistive switching memory cell of claim 1, wherein a thickness of the first resistive switching layer is within a range of about 15 angstroms (Å) and about 50 Å and a second thickness of the second resistive switching layer is within the range of about 15 Å and about 50 Å.

8. A resistive switching memory cell, comprising:
a bottom electrode;
a conductive layer overlying the bottom electrode;
a switching layer overlying and in physical contact with the conductive layer, wherein the switching layer comprises an electrically resistive material at least in part permeable to conductive particles;
a top electrode layer overlying and in physical contact with the switching layer, wherein the top electrode layer comprises a material of conductive particles capable of being ionized, wherein the conductive particles drift into the switching layer in response to a suitable electrical stimulus applied to the resistive switching memory cell; and
a capping layer overlying the top electrode layer;
wherein the switching layer and the top electrode layer further comprise:
a central core comprising the material of conductive particles overlying the electrically resistive material;
a perimeter shell about the central core formed of an oxidized, etch-fractured material of conductive particles overlying an oxidized, etch-fractured electrically resistive material.

9. The resistive switching memory cell of claim 8, wherein the material of conductive particles is selected from a group consisting of: a non-stoichiometric metal and nitrogen material, an aluminum (Al) material, an Al metal, a non-stoichiometric $AlN_x$, a stoichiometric or non-stoichiometric $AlNO_x$, TIN, Ti and W.

10. The resistive switching memory cell of claim 8, wherein the material of conductive particles comprises a metal, nitrogen and silicon material with less than 2 percent by atomic weight of silicon.

11. The resistive switching memory cell of claim 8, wherein the perimeter shell has a thickness measured from an outer surface of the perimeter shell to the central core of greater than 50 Å.

12. The resistive switching memory cell of claim 8, wherein the capping layer comprises W metal, TiN, TaN, an aluminum metal, or an electrically conductive doped silicon material.

13. The resistive switching memory cell of claim 8, wherein the switching layer comprises a non-stoichiometric aluminum-rich nitrogen material or a non-stoichiometric aluminum-rich oxygen material.

14. The resistive switching memory cell of claim 13, wherein the top electrode layer comprises a second non-stoichiometric aluminum-rich nitrogen material or a non-stoichiometric aluminum-rich oxygen material.

15. The resistive switching memory cell of claim 14, wherein the perimeter shell includes oxygen-anodized, etch-induced fractures, voids or byproducts within the non-stoichiometric aluminum-rich nitrogen or oxygen materials of the switching layer and the top electrode layer to a depth greater than 50 Å.

16. A method of fabricating a resistive switching device, comprising:
forming a conductive layer over a bottom electrode situated within a dielectric layer overlying a semiconductor substrate;
forming a switching layer overlying and in physical contact with the conductive layer, wherein the switching layer comprises an electrically resistive material at least in part permeable to conductive particles;

forming a top electrode layer overlying and in physical contact with the switching layer, wherein the top electrode layer provides the conductive particles that drift into the switching layer in response to an electrical stimulus applied across the bottom electrode and the top electrode;

forming a capping layer overlying the top electrode layer;

etching the capping layer, the top electrode layer and the switching layer to form a discrete resistive switching device comprising an etched capping layer, an etched top electrode layer and an etched switching layer;

selectively etching a perimeter of the discrete resistive switching device and removing an exterior portion of the etched top electrode layer to an interior depth; and depositing a high electrical resistive conformal oxide material about the resistive switching device and filling the interior depth of the etched top electrode, wherein the oxide material has an electrical resistance higher than the electrically resistive material of the switching layer, or has lower permeability to the conductive particles than the electrically resistive material of the switching layer.

17. The method of claim 16, wherein selectively etching the perimeter of the discrete resistive switching device further comprises etching the discrete resistive switching device with a dilute ammonium hydroxide or a dilute tetramethylammonium hydroxide (TMAH).

18. The method of claim 17, wherein the dilute ammonium hydroxide has a dilution ratio in a range from about 10000:1 solvent to ammonium hydroxide or TMAH to about 14000:1 solvent to ammonium hydroxide or TMAH.

19. The method of claim 16, wherein forming the top electrode layer further comprises depositing the top electrode layer with a stoichiometric or non-stoichiometric aluminum-rich nitrogen material utilizing a physical vapor deposition (PVD) process.

20. The method of claim 19, wherein forming the switching layer further comprises depositing the switching layer with a stoichiometric or non-stoichiometric aluminum oxide material utilizing a PVD process, wherein the stoichiometric or non-stoichiometric aluminum oxide material is resistant to the selective etch of the perimeter of the discrete resistive switching device.

21. The resistive switching memory cell of claim 1, further comprising a barrier layer overlying the top electrode and comprising W, Ti, TiN or TaN.

* * * * *